US011367540B2

(12) United States Patent
Bozalina et al.

(10) Patent No.: US 11,367,540 B2
(45) Date of Patent: Jun. 21, 2022

(54) LARGE SCALE PRODUCTION OF THINNED GRAPHITE, GRAPHENE, AND GRAPHITE-GRAPHENE COMPOSITES

(71) Applicant: NanoXplore Inc., Montreal (CA)

(72) Inventors: Marie Bozalina, Montreal (CA); Philippe Perret, Longueuil (CA); Soroush Nazarpour, Montreal (CA)

(73) Assignee: NanoXplore Inc., Montreal (CA)

(*) Notice: Subject to any disclaimer, the term of this patent is extended or adjusted under 35 U.S.C. 154(b) by 0 days.

(21) Appl. No.: 16/409,153

(22) Filed: May 10, 2019

(65) Prior Publication Data

US 2020/0031674 A1 Jan. 30, 2020

Related U.S. Application Data

(63) Continuation of application No. 15/270,855, filed on Sep. 20, 2016, now Pat. No. 10,322,935, which is a
(Continued)

(51) Int. Cl.
*H01B 1/04* (2006.01)
*B82Y 30/00* (2011.01)
(Continued)

(52) U.S. Cl.
CPC .............. *H01B 1/04* (2013.01); *B02C 17/20* (2013.01); *B02C 17/22* (2013.01); *B82Y 30/00* (2013.01);
(Continued)

(58) Field of Classification Search
CPC ........................................................ H01B 1/04
(Continued)

(56) References Cited

U.S. PATENT DOCUMENTS 5,871,586 A 2/1999 Crawley et al.
7,071,258 B1 7/2006 Jang et al.
(Continued)

FOREIGN PATENT DOCUMENTS

CN 102225759 A 10/2011
CN 103288078 A 9/2013
(Continued)

OTHER PUBLICATIONS

Non-Final Office Action dated May 26, 2016 for U.S. Appl. No. 14/978,566, 12 pages.
(Continued)

*Primary Examiner* — Tri V Nguyen
(74) *Attorney, Agent, or Firm* — Cooley LLP

(57) ABSTRACT

Embodiments described herein relate generally to large scale synthesis of thinned graphite and in particular, few layers of graphene sheets and graphene-graphite composites. In some embodiments, a method for producing thinned crystalline graphite from precursor crystalline graphite using wet ball milling processes is disclosed herein. The method includes transferring crystalline graphite into a ball milling vessel that includes a grinding media. A first and a second solvent are transferred into the ball milling vessel and the ball milling vessel is rotated to cause the shearing of layers of the crystalline graphite to produce thinned crystalline graphite.

20 Claims, 18 Drawing Sheets

Related U.S. Application Data continuation of application No. 14/978,566, filed on Dec. 22, 2015, now Pat. No. 9,469,542, which is a continuation of application No. PCT/CA2015/050525, filed on Jun. 8, 2015.

(60) Provisional application No. 62/035,963, filed on Aug. 11, 2014, provisional application No. 62/008,729, filed on Jun. 6, 2014.

(51) Int. Cl.

| | | |
|---|---|---|
| B02C 17/20 | (2006.01) | |
| B02C 17/22 | (2006.01) | |
| C01B 32/20 | (2017.01) | |
| C01B 32/225 | (2017.01) | |
| C01B 32/21 | (2017.01) | |
| C30B 29/02 | (2006.01) | |
| C30B 29/64 | (2006.01) | |
| C30B 33/00 | (2006.01) | |
| C09K 5/14 | (2006.01) | |
| C09D 1/00 | (2006.01) | |
| C09D 5/08 | (2006.01) | |
| C09D 5/24 | (2006.01) | |
| C10M 103/02 | (2006.01) | |
| C01B 32/184 | (2017.01) | |
| B82Y 40/00 | (2011.01) | |

(52) U.S. Cl.
CPC ............ *C01B 32/184* (2017.08); *C01B 32/20* (2017.08); *C01B 32/21* (2017.08); *C01B 32/225* (2017.08); *C09D 1/00* (2013.01); *C09D 5/084* (2013.01); *C09D 5/24* (2013.01); *C09K 5/14* (2013.01); *C10M 103/02* (2013.01); *C30B 29/02* (2013.01); *C30B 29/64* (2013.01); *C30B 33/00* (2013.01); *B82Y 40/00* (2013.01); *C01B 2204/04* (2013.01); *C10M 2201/0413* (2013.01)

(58) Field of Classification Search
USPC ........................................ 252/500, 502, 510
See application file for complete search history.

(56) References Cited

U.S. PATENT DOCUMENTS

| | | |
|---|---|---|
| 7,566,410 B2 | 7/2009 | Song et al. |
| 7,623,340 B1 | 11/2009 | Song et al. |
| 7,662,321 B2 | 2/2010 | Guo et al. |
| 7,745,047 B2 | 6/2010 | Zhamu et al. |
| 7,785,492 B1 | 8/2010 | Jang et al. |
| 7,790,285 B2 | 9/2010 | Zhamu et al. |
| 7,824,651 B2 | 11/2010 | Zhamu et al. |
| 7,875,219 B2 | 1/2011 | Zhamu et al. |
| 7,892,514 B2 | 2/2011 | Jang et al. |
| 7,897,283 B2 | 3/2011 | Matsumoto et al. |
| 7,999,027 B2 | 8/2011 | Zhamu et al. |
| 8,084,121 B2 | 12/2011 | Yonetake et al. |
| 8,114,373 B2 | 2/2012 | Jang et al. |
| 8,114,375 B2 | 2/2012 | Jang et al. |
| 8,119,288 B2 | 2/2012 | Zhamu et al. |
| 8,132,746 B2 | 3/2012 | Zhamu et al. |
| 8,192,643 B2 | 6/2012 | Zheng et al. |
| 8,216,541 B2 | 7/2012 | Jang et al. |
| 8,222,190 B2 | 7/2012 | Zhamu et al. |
| 8,241,793 B2 | 8/2012 | Zhamu et al. |
| 8,268,902 B2 | 9/2012 | Casalini et al. |
| 8,278,757 B2 | 10/2012 | Crain et al. |
| 8,414,799 B2 | 4/2013 | Pu et al. |
| 8,501,318 B2 | 8/2013 | Jang et al. |
| 8,501,348 B2 | 8/2013 | Zhamu et al. |
| 8,524,067 B2 | 9/2013 | Zhamu et al. |
| 8,580,432 B2 | 11/2013 | Zhamu et al. |
| 8,611,070 B2 | 12/2013 | Ivanovici et al. |
| 8,652,687 B2 | 2/2014 | Zhamu et al. |
| 8,672,246 B2 | 3/2014 | Lee et al. |
| 8,696,938 B2 | 4/2014 | Zhamu et al. |
| 8,697,485 B2 | 4/2014 | Crain et al. |
| 8,747,623 B2 | 6/2014 | Zhamu et al. |
| 8,753,539 B2 | 6/2014 | Zhamu et al. |
| 8,753,543 B2 | 6/2014 | Zhamu et al. |
| 8,753,740 B2 | 6/2014 | Zhamu et al. |
| 8,765,302 B2 | 7/2014 | Chen et al. |
| 8,784,694 B2 | 7/2014 | Kay |
| 8,784,695 B2 | 7/2014 | Choi et al. |
| 8,795,899 B2 | 8/2014 | Liu et al. |
| 8,865,113 B2 | 10/2014 | Shankman |
| 8,871,296 B2 | 10/2014 | Zhamu et al. |
| 8,883,114 B2 | 11/2014 | Zhamu et al. |
| 9,327,981 B2 | 5/2016 | Gee et al. |
| 9,469,542 B2 | 10/2016 | Bozalina et al. |
| 9,586,825 B2 | 3/2017 | Bozalina et al. |
| 9,890,046 B2 | 2/2018 | Bozalina et al. |
| 10,519,040 B2 | 12/2019 | Bozalina et al. |
| 2009/0022649 A1 | 1/2009 | Zhamu et al. |
| 2009/0169467 A1 | 7/2009 | Zhamu et al. |
| 2010/0140792 A1* | 6/2010 | Haddon ............... H01L 23/373 257/713 |
| 2010/0222482 A1* | 9/2010 | Jang ..................... C01B 32/22 524/424 |
| 2011/0319554 A1 | 12/2011 | Frazier et al. |
| 2012/0077035 A1 | 3/2012 | Spahr et al. |
| 2013/0018204 A1 | 1/2013 | Jeon et al. |
| 2013/0161199 A1 | 6/2013 | Li et al. |
| 2013/0211106 A1* | 8/2013 | El-Shall ................ B01J 19/126 549/445 |
| 2013/0309495 A1 | 11/2013 | Do et al. |
| 2014/0044968 A1 | 2/2014 | Papakonstantinou et al. |
| 2014/0255785 A1* | 9/2014 | Do ........................ H01B 1/04 429/231.8 |
| 2015/0274532 A1 | 10/2015 | Fujiwara et al. |
| 2015/0279506 A1 | 10/2015 | Wolfrum et al. |
| 2017/0096343 A1 | 4/2017 | Bozalina et al. |
| 2020/0207626 A1 | 7/2020 | Bozalina et al. |

FOREIGN PATENT DOCUMENTS

| | | | |
|---|---|---|---|
| CN | 103407998 A | 11/2013 | |
| CN | 103570004 A | 2/2014 | |
| CN | 103626162 A | 3/2014 | |
| CN | 103708445 A | 4/2014 | |
| KR | 101502390 B1 * | 3/2015 | ............ B01J 19/10 |
| WO | WO 2011/054305 A1 | 5/2011 | |
| WO | WO 2012/058553 A2 | 5/2012 | |
| WO | WO 2012/117251 A1 | 9/2012 | |
| WO | WO 2014/053510 A1 | 4/2014 | |
| WO | WO 2014/138596 A1 | 9/2014 | |
| WO | WO 2015/184555 A1 | 12/2015 | |

OTHER PUBLICATIONS

Non-Final Office Action dated Feb. 15, 2018 for U.S. Appl. No. 15/270,855, 7 pages.
Non-Final Office Action dated Jul. 2, 2018 for U.S. Appl. No. 15/854,419, 6 pages.
Final Office Action dated Mar. 13, 2019 for U.S. Appl. No. 15/854,419, 14 pages.
Examination Report No. 1 dated Apr. 20, 2018 for Australian Application No. 2015271619, 4 pages.
Examination Report No. 2 dated Jan. 8, 2019 for Australian Application No. 2015271619, 5 pages.
Examination Report No. 1 dated Aug. 2, 2019 for Australian Application No. 2019205999, 5 pages.
Extended European Search Report dated Feb. 28, 2018 for European Application No. 15802987.6, 12 pages.
International Search Report and Written Opinion dated Sep. 1, 2015 for International Application No. PCT/CA2015/050525, 8 pages.
Examination Report No. 1 dated Oct. 3, 2018 for Australian Application No. 2015362043, 2 pages.

(56) References Cited

OTHER PUBLICATIONS

Extended European Search Report dated Jul. 4, 2018 for European Application No. 15867576.9, 7 pages.

International Search Report and Written Opinion dated Feb. 15, 2016 for International Application No. PCT/CA2015/051292, 9 pages.

Aparna, R. et al., "An effective route to rpoduce few-layer graphene using combinatorial ball milling and strong aqueous exfoliants," J. Reneweable Sustainable Energy 5: 033123 (2013); doi: 10.1063/1.4809794, 12 pages.

Eigler, S. & Hirsch, A., "Chemistry with Graphene and Graphene Oxide—Challenges for Synthetic Chemists," Angew. Chem. Int. Ed. 53: 7720-7738 (2014).

Knieke, C. et al., "Scalable production of graphene sheets by mechanical delamination," Carbon 48: 3196-3204 (2010).

Leon, V. et al., "Exfoliation of Graphite with Triazine Derivatives under Ball-Milling Conditions: Preparation of Few-Layer Graphene via Selective Noncovalent Interactions," ACS Nano, 8: 563-571 (2014).

Nonomura, Y. et al., "Anomalously stable dispersions of graphite in water/acetone mixtures," Journal of Colloid and Interface Science 346: 96-99 (2010).

Nuvoli, D. et al., "High concentration few-layer graphene sheets obtained by liquid phase exfoliation of graphite in ionic liquid," published electronically on Dec. 20, 2010, Journal of Materials Chemistry 21(10): 3428-3431 (2010).

Powell, M. et al., "The Selection and Design of Mill Liners," In Advances in Comminution, Ed. S.K. Kawatra. ISBN-13: 978-0-87335-246-8, Society for Mining, Metallurgy, and Exploration, Inc., Colorado, USA, pp. 331-376 (2006).

Sun, L., "Unexpected colloid-like supernatant from liquid-phase ball-milling graphite using miscible solutions as solvents: a failure analysis," online http://arxiv.org/ftp/arxiv/papers/1309/1309.1056, Sep. 4, 2013.

Tang, Q. et al., "Crystallization degree change of expanded graphite by milling and annealing," Journal of Alloys and Compounds 475: 429-433 (2009).

Woltornist, S. J. et al., "Conductive Thin Films of Pristine Graphene by Solvent Interface Trapping," ACS Nano 7(8): 7062-7066 (2013).

Yamanaka, S. et al., "Production of thin graphite sheets for a high electrical conductivity film by the mechanical delamination of ternary graphite intercalation compounds," Carbon 50: 5027-5033 (2012).

Yan, L. et al., "Electroactive and biocompatible hydroxyl-functionalized graphene by ball milling," J. Mater. Chem. 22: 8367-8371 (2012).

Zhang, D. et al., "High performance supercapacitor electrodes based on deoxygenated graphite oxide by ball milling," Electrochimica Acta 109: 874-880 (2013).

Zhang, L. L. et al., "Highly Conductive and Porous Activated Reduced Graphene Oxide Films for High-Power Supercapacitors," Nano Letters 12: 1806-1812 (2012).

Zhao, W. et al., "Preparation of graphene by exfoliation of graphite using wet ball milling," Journal of Materials Chemistry 20: 5817-5819 (2010).

Xing, W. et al., "Degradation of Graphene by Hydrogen Peroxide," Part. Part. Syst. Charact. 31: 745-750 (2014).

Shen, T. D. et al., "Structural disorder and phase transformation in graphite produced by ball milling," Nanostructured Materials, 7(4):393-399 (1996).

\* cited by examiner

FIG. 4A
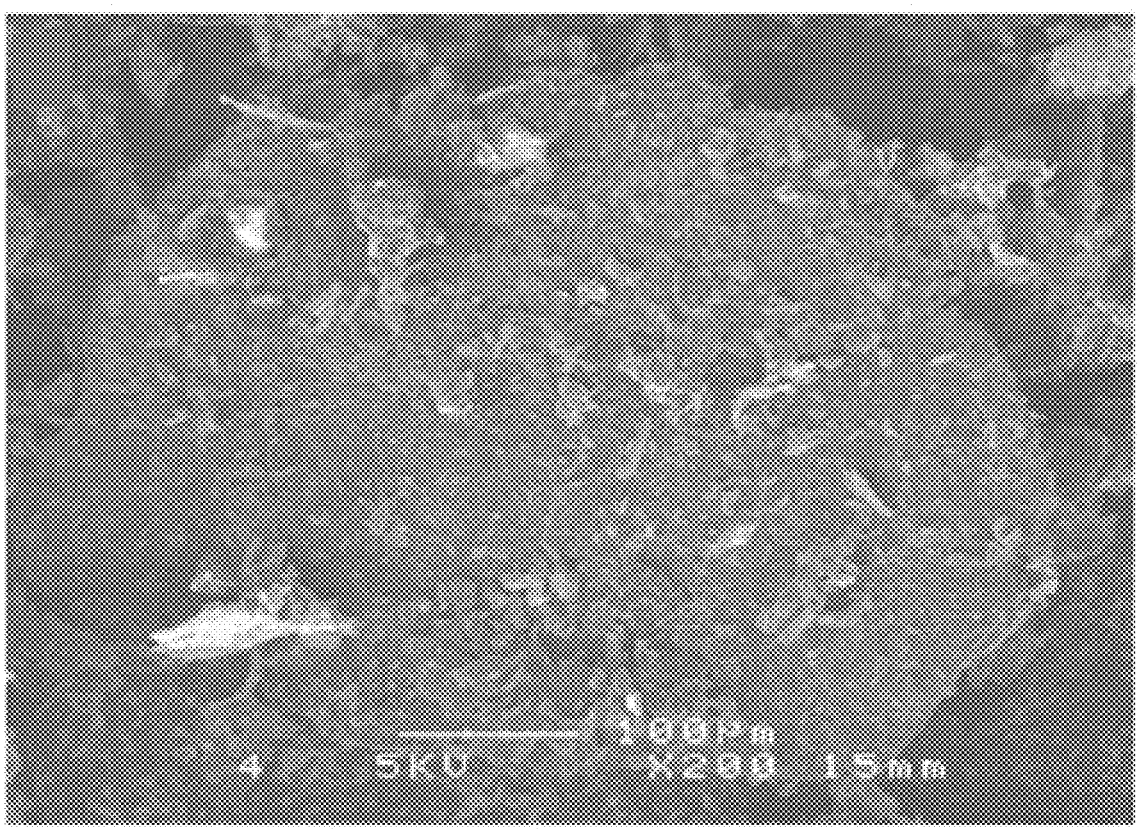
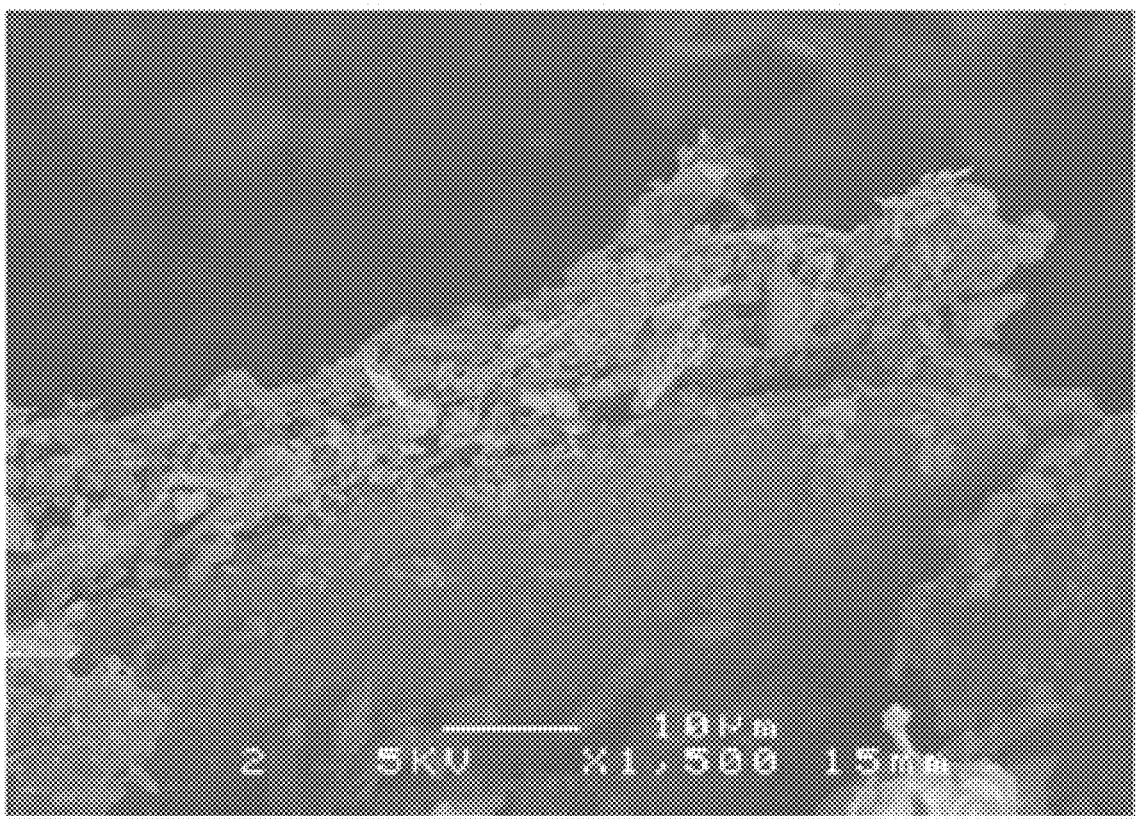
FIG. 4B

LARGE SCALE PRODUCTION OF THINNED GRAPHITE, GRAPHENE, AND GRAPHITE-GRAPHENE COMPOSITES

CROSS-REFERENCE TO RELATED APPLICATIONS

This application is a continuation of U.S. patent application Ser. No. 15/270,855, filed Sep. 20, 2016, now U.S. Pat. No. 10,322,935, entitled "LARGE SCALE PRODUCTION OF THINNED GRAPHITE, GRAPHENE, AND GRAPHITE-GRAPHENE COMPOSITES," which is a continuation of U.S. patent application Ser. No. 14/978,566, filed Dec. 22, 2015, now U.S. Pat. No. 9,469,542, entitled "LARGE SCALE PRODUCTION OF THINNED GRAPHITE, GRAPHENE, AND GRAPHITE-GRAPHENE COMPOSITES," which is a continuation of International Patent Application No. PCT/CA2015/050525, filed Jun. 8, 2015, entitled "LARGE SCALE PRODUCTION OF THINNED GRAPHITE, GRAPHENE, AND GRAPHITE-GRAPHENE COMPOSITES," which claims priority to and the benefit of U.S. Provisional Patent Application No. 62/008,729, filed Jun. 6, 2014, entitled "Large Scale Production of Large Sheets of Few or Multi-Layer Graphene," and U.S. Provisional Patent Application No. 62/035,963, filed Aug. 11, 2014, entitled "Large Scale Production of Thinned Graphite and Graphite-Graphene Composites," the disclosures of which are hereby incorporated by reference in their entirety.

BACKGROUND

Graphene is a single, one atomic layer of carbon atoms with several exceptional electrical, mechanical, optical, and electrochemical properties, earning it the nickname "the wonder material." To name just a few, it is highly transparent, extremely light and flexible yet robust, and an excellent electrical and thermal conductor. Such extraordinary properties render graphene and related thinned graphite materials as promising candidates for a diverse set of applications ranging from energy efficient airplanes to extendable electronic papers. For example, graphene based batteries may allow electric cars to drive longer and smart phones to charge faster. As further examples, graphene can also filter salt, heavy metals, and oil from water, efficiently convert solar energy, and when used as coatings, prevent steel and aluminum from rusting. In the longer term, thinned crystalline graphite in general promises to give rise to new computational paradigms and revolutionary medical applications, including artificial retinas and brain electrodes.

SUMMARY

Embodiments described herein relate generally to large scale synthesis of thinned graphite and in particular, few layers of graphene sheets and graphene-graphite composites. In some embodiments, a method for producing thinned crystalline graphite from precursor crystalline graphite using wet ball milling processes is disclosed herein. The method includes transferring crystalline graphite into a ball milling vessel that includes a grinding media. A first and a second solvent are transferred into the ball milling vessel and the ball milling vessel is rotated to cause the shearing of layers of the crystalline graphite to produce thinned crystalline graphite.

BRIEF DESCRIPTION OF THE DRAWINGS

FIG. 4 is a scanning electron microscope (SEM) micrograph of a graphene-graphite composite produced via a wet ball milling process, according to an embodiment.

DETAILED DESCRIPTION

Figure 1:
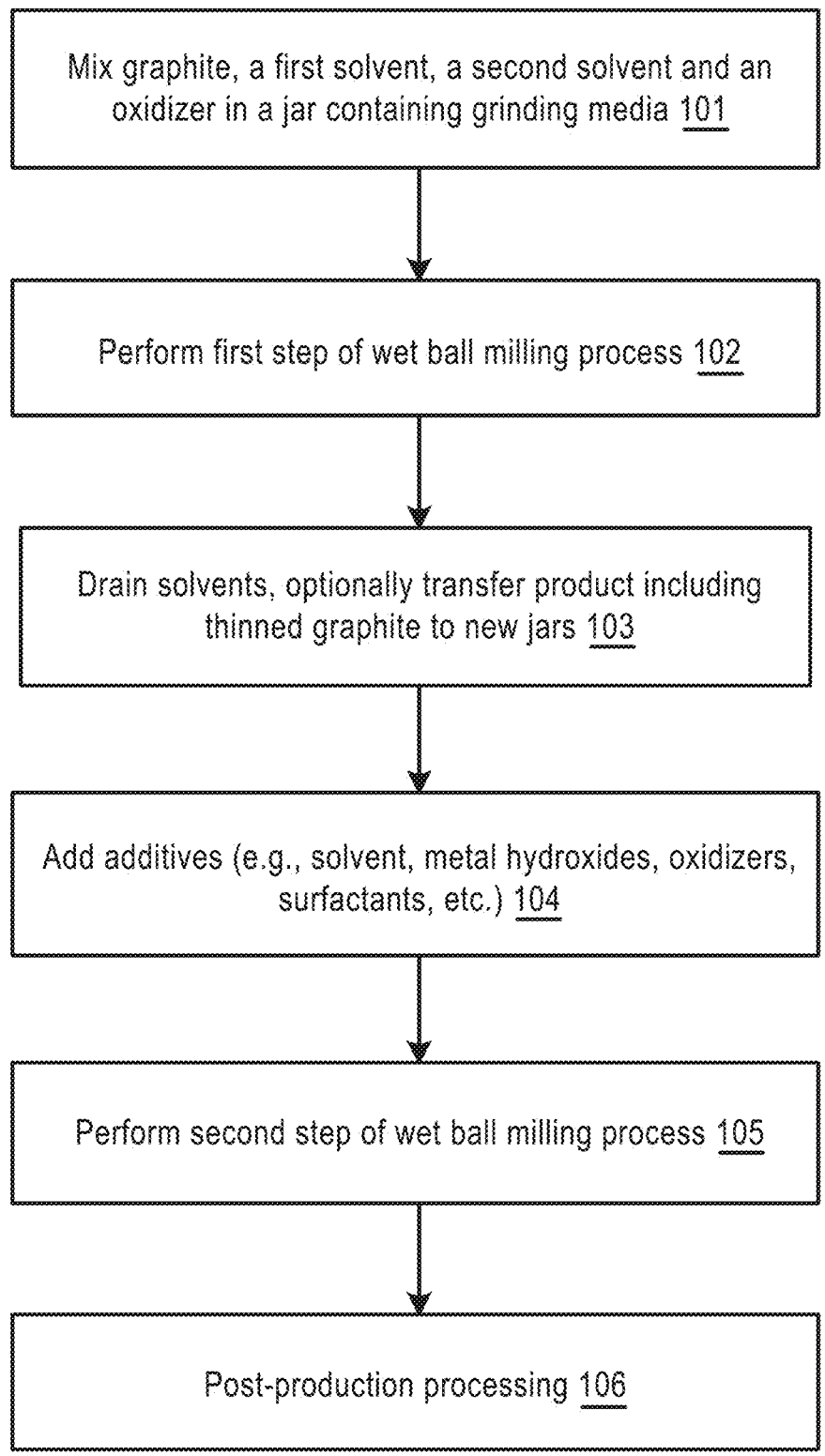
FIG. 1 is a schematic flowchart illustrating a method of producing thinned crystalline graphite, graphene and/or a graphene-graphite composite via a wet ball milling process, according to an embodiment.

Embodiments described herein relate generally to large scale synthesis of thinned graphite, and in particular, few layers of graphene sheets and graphene-graphite composites.

Few-layer graphene (FLG) sheets can be produced via various processes, including exfoliation of crystalline graphite, epitaxial growth, chemical vapor deposition (CVD), the reduction of graphene oxide, and/or the like. Some of these processes are not suitable for large scale productions of FLG sheets. For example, micromechanical cleavage, colloquially known as the "Scotch Tape" method where single and/or few-layer graphene sheets are exfoliated off of graphite by using adhesive tapes to peel off the sheets is usually an unpredictable process that tends to produce small flakes, and as such, at least for this reason doesn't lend itself for a large-scale production of FLG sheets with large flake sizes and/or substantial flake size to thickness form factors.

Processes such as epitaxial growth and CVD also suffer from several disadvantageous as scalable production methods of large flake sized FLG sheets. Both of these processes require vacuum settings for the production of FLG sheets, which increases the cost and complexity of production and limits the applicability of these methods for large scale synthesis of FLG sheets. In addition, both of these methods require post-production processing steps to remove the FLG sheets from the substrates used for growth or deposition, further undermining the appeal of these methods for large scale FLG production for a variety of purposes (e.g., as additives in composites with polymers and ceramics).

Reduction of graphene oxide to obtain FLG sheets and/or graphene-graphite composites also poses several problems that contribute to the unsuitability of graphene oxide reduction as a practical and scalable method for producing FLG sheets and/or graphene-graphite composites. For example, the quality of graphene obtained from such processes is dependent on the quality of the precursor graphene oxide and the reducing agent, rendering the process unreliable and inconsistent, and usually producing graphene with poor crystalline quality and high in-plane defect density. Further, the reduction processes require the use of highly hazardous and unstable chemicals that increase the risks of toxic gas releases and other environmentally unfriendly consequences. In light of at least these issues, graphene oxide reduction processes do not commend themselves as methods of large scale production of FLG sheets and/or graphene-graphite composites of large flake sizes and/or substantial flake size to thickness form factors.

Conventional methods that avoid using the above hazardous chemicals include sonication of graphite in organic solvents to produce FLG sheets can suffer other disadvantages. For example, such processes are notoriously time consuming, making them unattractive as a method of choice for large scale FLG sheet production. Further, the yield rate is quite low, typically less than about 15% by weight, and additional, multi-step processes are required to exfoliate the remaining unexfoliated graphite. In addition, separating the exfoliated sheets from the unexfoliated graphite is another tedious and time-consuming process. For at least these reasons, the aforementioned conventional methods prove themselves to be unsuitable as processes capable of producing large flake-sized thinned graphite in a scalable manner.

Production processes according to the embodiments described herein overcome at least some of the disadvantages and shortcomings of the above methods and processes for producing FLG sheets in a scalable and environmentally friendly manner. In some embodiments, the processes of the present disclosure include a two-step wet ball milling process where one of the steps is largely mechanical and the other step is largely electrochemical. These processes, individually and/or in combination can be configured to produce thinned graphite and/or graphite-graphene composites starting with a crystalline graphite precursor material. The thinned graphite (e.g., single layer graphene, FLGs, etc.) and/or graphite-graphene composites produced at least substantially according to the wet ball milling processes described herein have several beneficial properties, especially compared to the products of the methods and processes discussed above.

In some embodiments, the processes described herein can be configured to produce thinned graphite and/or graphene-graphite composites that substantially maintain the in-plane size of the precursor crystalline graphite. For example, starting with graphite possessing substantial in-plane dimensions, in some embodiments, the disclosed wet-ball milling processes can produce graphene and/or thinned graphite that have substantially similar in-plane dimensions as the precursor material. In some embodiments, the resulting thinned graphite may possess a substantial flake size to thickness form factor, indicating that during the thinning of the precursor graphite by the wet-ball milling process, the in-plane dimensions of the precursor graphite have not been reduced significantly, as compared to some of the above processes such as the Scotch Tape method where the flake sizes of the peeled off graphene or thinned graphite sheets are significantly smaller than the initial graphite material.

The "efficiency" and/or effectiveness of producing thinned graphite while avoiding or minimizing reduction in lateral sheet size can be characterized by a parameter such as an aspect ratio of the final product of the process (e.g., thinned graphite, single layer graphene, FLG, etc. The aspect ratio can be defined as a ratio of an in-plane lateral dimension (also referred to herein as "lateral size") to the thickness of the final product. For example, if a thinned crystalline graphite final product has an average lateral dimension of 300 μm and a thickness of 200 nm, the sheet size to thickness ratio, or "aspect ratio", can be defined as 300,000/200 (i.e., 1,500). As another example, if a FLG final product has an average lateral dimension of 1 μm and a thickness of 1 nm (e.g., approximately three layers of graphene), the aspect ration can be defined as 1,000/1 (i.e., 1,000).

In some embodiments, the precursor graphite and/or the thinned crystalline graphite may not have a regular shape that allows for a convenient identification of a measure of a lateral size, or even a thickness. For example, as described herein, the precursor graphite can assume different forms, including rods, fibers, powders, flakes, and/or the like. However, in some embodiments, depending on at least the geometry of the precursor graphite/thinned graphite, generalized definitions of thickness and/or lateral size can be used in characterizing these quantities. In some embodiments, the thickness and/or the in-plane lateral size of crystalline graphite in irregular forms can be characterized by a suitable linear dimension, and/or average of linear dimensions. For example, the thickness can be defined as some suitable length (e.g., height from topmost layer to bottom-most layer of a regularly layered graphite flake, average height if irregularly shaped, etc.) in substantially the same direction as the direction normal to the surfaces of the layered graphene sheets. As another example, the lateral size of crystalline graphite may be defined by some appropriate linear dimension and/or combination of dimensions along the surface of the graphite (e.g., diameter, average of several linear dimensions along the surface, a linear dimension appropriately normalized by shape factors that take the geometrical irregularity of the graphite into consideration, etc.). In any case, suitable linear dimensions that characterize the thickness and the lateral size of crystalline graphite in an acceptable manner may be used in defining the aspect ratio as the ratio of the lateral size to the thickness.

In some embodiments, the wet ball milling processes described herein can be configured to produce a final product with an aspect ratio much higher than values previously reported. For example, in some embodiments, the wet ball milling process can reduce the thickness of a bulk precursor crystalline graphite to produce a thinned graphite having a thickness of about 400 nm, or even lower, without a substantial reduction in the lateral sheet size of the precursor material (e.g., 500 μm or higher). In such embodiments, in reducing the thickness of the precursor graphite to down to 400 nm, the wet ball milling process can produce a thinned graphite material having an aspect ratio of at least about 50, about 100, about 250, about 500, about 750, about 1,000, etc., and all values and ranges therebetween. In some embodiments, a second ball milling process can be configured to produce a thinned graphite material and/or FLG sheets having an aspect ratio of at least about 1,000, about 1,250, about 1,500, about 1,750, about 2,000, etc., inclusive of all values and ranges therebetween. In some embodiments, these aspect ratios correspond to the reduction of crystalline graphite with large lateral size to FLG sheets (including single layer) that largely maintain the substantial lateral size.

Further, the relative ease of at least some of the processes of the present disclosure in view of other processes such as epitaxial growth and CVD render these processes suitable for large scale production of thinned graphite and/or graphene-graphite composites. As described herein, processes such as epitaxial growth and CVD are expensive at least for the reasons that they require a vacuum setting and costly post-production processing steps at least as a result of the substrate materials that are needed during the growth/deposition processes. Moreover, as will be described in more detail below, in some embodiments, the precursor materials and the process conditions of the processes disclosed herein are inexpensive and not burdensome, in contrast to at least some of the processes described above.

In some embodiments, the wet ball milling processes of the present disclosure produces high-yield and/or high-quality thinned graphite and/or graphite-graphene composites. For example, the processes described herein can be configured to produce thinned graphite at a yield of grater than about 80%, about 85%, about 90%, about 95%, and even in excess of about 99% purity by weight. In other words, the processes described herein can be configured to produce thinned graphite at a yield that is significantly higher than the 15% yield rate of other conventional methods. Such high yield rate carries the further advantage that post-production processing steps to further thin the un-thinned graphite and/or otherwise purify the final product can be reduced or event eliminated, thereby, reducing the cost and complexity that can arise from such steps.

In some embodiments, the wet ball milling processes described herein can be configured to produce a graphene-graphite composite material. In forming a bond with graphite (e.g., thinned graphite), graphene has a tendency to stack over the graphitic planes and become another layer in the layered structure of graphite, thereby frustrating attempts to produce graphene-graphite composites where the edges of the respective graphene and graphite are covalently bonded. The wet ball milling processes of the present disclosure can be configured to overcome these difficulties by, amongst other things, control and selective functionalization of the edge structure of graphene so as to activate covalent bonding and allow formation of graphene-graphite composites.

In some embodiments, a method for producing thinned crystalline graphite, comprising the steps of transferring crystalline graphite into a ball milling vessel, transferring a first solvent and a second solvent into the ball milling vessel, and rotating the ball milling vessel to cause shearing of layers of the crystalline graphite to produce thinned crystalline graphite is disclosed. In some embodiments, the crystalline graphite includes at least one of natural graphite, synthetic graphite, highly oriented pyrolytic graphite (HOPG), graphite fiber, graphite rods, graphite minerals, graphite powder, and chemically modified graphite. In some embodiments, the ball milling vessel includes a grinding media coated with an insulator, alumina, and/or zirconia. In some embodiments, the grinding media and the crystalline graphite may be selected so that the mass ratio of the grinding media to the crystalline graphite is in a range of about 1:1 to about 60:1, about 5:1 to about 30:1, etc. In some embodiments, the ball milling vessel includes at least one of an attritor ball mill, a planetary ball mill and a shear mixer, and further comprises a semiconductor and/or an insulator material.

In some embodiments, the first solvent can be different than the second solvent, and may have a first surface tension different than a second surface tension of the second solvent, wherein the difference between the first surface tension and the second surface tension is configured to facilitate the shearing of layers of the crystalline graphite. For example, the first surface tension can be in the range of about 10 mN/m to about 50 mN/m, and the second surface tension can be in the range from about 50 mN/m to about 100 mN/m, and in some embodiments, both the first surface tension and the second surface tension can be in the range of about 10 mN/m to about 50 mN/m. In some embodiments, the difference between the first surface tension and the second surface tension can be in the range of about 0 N/m to about 75 mN/m, or about 40 mN/m to about 60 mN/m, etc. Further, the first solvent and the second solvent can be configured to trap at least a portion of the crystalline graphite between the first solvent and the second solvent. For example, the first solvent can have a first density and the second solvent can have a second density different than the first density, the difference between the first density and the second density can be configured to facilitate the trapping of the at least a portion of the crystalline graphite between the first solvent and the second solvent. For example, the first density can be in the range of about 500 kg/m$^3$ to about 850 kg/m$^3$, and the second density can be in the range of about 850 kg/m$^3$ to about 1,200 kg/m$^3$. In some embodiments, both the first density and the second density can be in the range of about 650 kg/m$^3$ to about 850 kg/m$^3$, and yet in some embodiments, the difference between the first density and the second density can be in the range of about 0 kg/m$^3$ to about 1,200 kg/m$^3$.

In some embodiments, the first solvent and the second solvent can include any two of water, heptane, ethanol, and acetonitrile. For example, the first solvent can be water and the second solvent can be heptane, and they can be used in the wet ball milling process in the volumetric ratio in the range of about 1:20 to about 1:1, in the range of about 1:10 to about 1:5, etc. As another example, the first solvent can be ethanol and the second solvent can be acetonitrile.

In some embodiments, the product of the wet ball milling process, the thinned crystalline graphite can have a thickness in the range of about 1 graphene layer to about 1,200 graphene layers, about 1 graphene layer to about 100 graphene layers, about 1 graphene layer to about 10 graphene layers, about 1 graphene layer to about 3 graphene layers, etc. In some embodiments, the thinned crystalline graphite can have a thickness of less than about 400 nm, less than about 300 nm, less than about 200 nm, less than about 100 nm, less than about 50 nm, less than about 20 nm, less than about 10 nm, less than about 5 nm, less than about 1 nm, etc. In some embodiments, the thinned crystalline graphite and/or the precursor crystalline graphite can have a lateral dimension of in a range of about 10 nm to about 500 μm. For example, an average lateral dimension of the crystalline graphite can range at least up to about 800 μm, at least up to about 500 μm, at least up to about 200 μm, etc. In some embodiments, the average lateral dimension can be in a range from about 200 nm to about 20 μm, from about 200 nm to about 500 nm, from about 500 nm to about 5 μm, from about 5 μm to about 20 μm, etc. In some embodiments, when the average lateral size is in the range from about 5 μm to about 20 μm, the thickness of the crystalline graphite can be about 3 to 4 graphene layers (equivalently about 0.9 nm to about 1.2 nm), corresponding to an aspect ratio ranging from about 5 μm/1.2 nm (i.e., ~4,000) to about 20 μm/0.9 nm (i.e., ~22,000). In some embodiments, when the average lateral size is in the range from about 0.5 μm to about 5 μm, the thickness of the crystalline graphite can be about 2 to 3 graphene layers (equivalently about 0.3 nm to about 0.6 nm), corresponding to an aspect ratio ranging from about 0.5 μm/0.6 nm (i.e., ~830) to about 5/0.3 nm (i.e., 1,500). And yet in some embodiments, when the average lateral size is in the range from about 0.2 μm to about 0.5 μm, the thickness of the crystalline graphite can be about 1 to 2 graphene layers (equivalently from single atom layer to about 0.3 nm graphene interlayer spacing), corresponding to an aspect ratio of about 1,000.

In some embodiments, the wet ball milling process includes rotating the ball milling jar or vessel at a desired speed for a given duration of time. For example, to produce the thinned crystalline graphite, in some embodiments, the ball milling vessel is rotated for about 2 hours to about 100 hours, for about 3 hours to about 48 hours, for about 3 hours to about 24 hours, etc. The speeds the milling vessel is rotated at can also range from about 10 rpm to about 225 rpm, from about 10 rpm to about 150 rpm, from about 25 rpm to about 75 rpm, and/or the like.

In some embodiments, the method for producing thinned crystalline graphite can include a second wet ball milling process. The process can include isolation of the thinned crystalline graphite from the first solvent and the second solvent, either by draining the first solvent and the second solvent from the ball milling vessel, and/or transferring the thinned crystalline graphite to a second ball milling vessel. In some embodiments, the method includes the addition of additional solvents and/or additives into the ball milling vessel containing the thinned crystalline graphite. For example, the method can include transferring a metal hydroxide salt into the second ball milling vessel, transferring a third solvent into the second ball milling vessel, transferring an oxidizer into the second ball milling vessel, and rotating the second ball milling vessel to generate an electrostatic charge, wherein oxygen released from a hydroxyl ion that is ionized by the generated electrostatic charge intercalates the thinned crystalline graphite to exfoliate layers of the thinned crystalline graphite. In some embodiments, the metal hydroxide salt can be formulated to release a hydroxyl ion upon ionization by the electrostatic charge, and may include at least one of alkali metals, alkaline earth metals, and elements of the boron group. In some embodiments, the third solvent can be formulated to facilitate diffusion of the hydroxyl ion and/or production of the electrostatic charge in the second ball milling vessel. Examples of the third solvent include includes at least one of N,N-Dimethylformamide, chlorobenzene, dimethyl sulfoxide, N-methyl-2-pyrrolidinone, 1-propanol, and mixtures thereof.

In some embodiments, the method may further include the step of transferring a fourth solvent into the second ball milling vessel, wherein the forth solvent has a fourth surface tension different from the third surface tension of the third solvent. In some embodiments, the difference between the third surface tension and the fourth surface tension can be configured to facilitate the shearing of the layers of the thinned crystalline graphite. In some embodiments, the volumetric ratio of the fourth solvent to the third solvent is in a range of about 1:50 to about 1:1, in a range of about 1:20 to about 1:5, and/or the like.

In some embodiments, the oxidizer can be formulated to interact with the hydroxyl ion to release oxygen that may be at least partially responsible for the exfoliation of the thinned graphite. In some embodiments, the oxidizer, an example of which includes hydrogen peroxide, may comprise less than about 3 percent, about 1%, etc., of the contents of the second ball milling vessel.

In some embodiments, the method of producing thinned crystalline graphite may include the process of ball milling the contents of the second ball milling vessel by rotating the vessel at some desired speed for a given duration of time. For example, to exfoliate the layers of the thinned crystalline graphite, in some embodiments, the second ball milling vessel may be rotated for a time duration ranging from about 2 hours to about 100 hours, from about 2 hours to about 10 hours, from about 1 hour to about 6 hours, etc. The speed of rotation may include, in some embodiments, a speed ranging from about 10 rpm to about 250 rpm, from about 150 rpm to about 225 rpm, from about 10 rpm to about 75 rpm, etc.

In some embodiments, surfactants can be used for, amongst other things, to avoid the agglomeration of the contents of the second ball milling vessel. Accordingly, in some embodiments, the method may further include the step of transferring a surfactant into the second ball milling vessel, the surfactant formulated to increase the conductivity of the contents of the second ball milling vessel. In some embodiments, the concentration of the surfactants to be included may vary from about 10 μMolar to about 100 μMolar, from about 10 μMolar to about 50 μMolar, etc. Examples of the surfactants include at least one of sodium dodecyl sulfate (SDS), pyridinium (PY+), thionin acetate salt, and triton.

In some embodiments, the resulting thinned graphite can be mixed with other materials to, for example, produce composites suited for various purposes. For example, the exfoliated graphite can be mixed with a metal to produce a metal-thinned graphite composite with enhanced thermal conductivity. Examples of such metals include but are not limited to titanium, copper, and silicon. In some embodiments, the materials can be oxides such as titanium oxide and titanium dioxide, and the resulting oxide-thinned graphite composite may possess improved thermal and/or electrical conductivities. Such enhanced thermal and/or electrical conductivities allow for the composite materials to be used in various applications, including cooling systems, electrical systems, etc.

As used herein, the term "crystalline graphite" or "precursor crystalline graphite" refers to graphite based material of a crystalline structure with a size configured to allow ball milling in a ball milling jar. For example, the crystalline graphite can be layered graphene sheets with or without defects, such defects comprising vacancies, interstitials, line defects, etc. The crystalline graphite may come in diverse forms, such as but not limited to ordered graphite including natural crystalline graphite, pyrolytic graphite (e.g., highly ordered pyrolytic graphite (HOPG)), graphite fiber, graphite rods, graphite minerals, graphite powder, flake graphite, any graphitic material modified physically and/or chemically to be crystalline, and/or the like. As another example, the crystalline graphite can be graphite oxide.

As used herein, the term "thinned graphite" refers to crystalline graphite that has had its thickness reduced to a thickness from about a single layer of graphene to about 1,200 layers, which is roughly equivalent to about 400 nm. As such, single layer graphene sheets, few-layer graphene (FLG) sheets, and in general multi-layer graphene sheets with a number of layers about equal to or less than 1,200 graphene layers can be referred as thinned graphite.

As used herein, the term "few-layer graphene" (FLG) refers to crystalline graphite that has a thickness from about 1 graphene layer to about 10 graphene layers.

As used herein, the term "lateral size" or "lateral sheet size" relates to the in-plane linear dimension of a crystalline material. For example, the linear dimension can be a radius, diameters, width, length, diagonal, etc., if the in-plane shape of the material can be at least approximated as a regular geometrical object (e.g., circle, square, etc.). If the in-plane shape of the material can not be modeled by regular geometrical objects relatively accurately, the linear dimension can be expressed by characteristic parameters as is known in the art (e.g., by using shape or form factors).

As used herein, the term "grinding media" or "milling balls" refer to any grinder that can be used in the exfoliation and thinning of crystalline graphite in ball milling jars. Even though the common nomenclature "milling balls" is used, the grinding media or the milling balls are not limited to a particular geometry, and can have any desired property such as shape, size, composition, etc.

In some embodiments, with reference to FIG. 1, crystalline graphite, one or more solvents, and a grinding media can be added into a ball milling vessel to commence a wet ball milling process for a large scale production of thinned graphite and/or graphene-graphite composites, e.g., step 101. In some embodiments, an oxidizer can also be included in the ball milling vessel. In some embodiments, the wet ball milling process can be a two-step or two stage wet ball milling process. In some embodiments, the crystalline graphite comprises ordered graphite including natural crystalline graphite, pyrolytic graphite (e.g., highly ordered pyrolytic graphite (HOPG)), graphite fiber, graphite rods, graphite minerals, graphite powder, flake graphite, any graphitic material modified physically and/or chemically to be crystalline, and/or the like. The lateral or in-plane size of the ordered graphite can assume a wide range of values. For example, using an appropriate measure to quantify the lateral size of the ordered graphite (e.g., mean lateral sizes, diameter, etc., depending on the shape, for example), the lateral sheet size of the ordered graphite can range from about 10 nm to about 500 µm. Some embodiments of the graphite thinning processes disclosed herein can be configured to produce thinned graphite that substantially preserves the large lateral sizes of the precursor crystalline graphite. As such, in some embodiments, the resulting thinned graphite can have a lateral sheet size in the range of from about 10 nm to about 500 µm.

In some embodiments, any solvents capable of aiding in the exfoliation of the layers of the ordered crystalline graphite can be used in the processes disclosed herein. In some embodiments, the volume of total solvent content to be used in the processes can depend on the amount of the precursor crystalline graphite. However, the proportion of a first solvent to a second solvent can be designed to allow maximal contact of the solvents to crystalline graphite surface area so as to allow enhanced shearing of layers of the crystalline graphite as a result of density and/or surface tension differentials of the solvents. For example, the solvents can include two solvents that have different surface tensions, and can also be immiscible or semi-miscible solvents incapable of making a homogenous mixture when combined. Said another way, the solvents chosen may have properties configured to trap the crystalline graphite between the solvents (e.g. at their interface). In addition, the crystalline graphite can be exposed to a surface tension differential shear force that contributes to the shearing of the layers, and hence the thinning of the graphite material during wet ball milling processes. In some embodiments, at least one of the one or more solvents can be configured to penetrate between layers of the ordered graphite and weaken the forces (e.g., van der Waals force) that hold the layers together, thereby contributing to the thinning of the graphite during the ball milling processes.

In some embodiments, the one or more immiscible or semi-miscible solvents can be selected so as to possess large differences in their respective densities and/or surface tensions. In most cases, large differences in densities lead to the formation of separate layers of solvents with the lighter solvent (i.e., the solvent with lower density) residing above the denser solvent. In some instances, this facilitates the trapping of the graphite material in between the layers of the two solvents. As an example, one of the two solvents can have a density ranging from about 400 kg/m$^3$ to about 800 kg/m$^3$ and the other can have a density ranging from about 800 kg/m$^3$ to about 1,200 kg/m$^3$, and the differences in their densities allows them to trap crystalline graphite in between them. Thus, the difference in densities of the two solvents can be in the range of about 0 kg/m$^3$ to about 800 kg/m$^3$, from about 100 kg/m$^3$ to about 700 kg/m$^3$, from about 200 kg/m$^3$ to about 600 kg/m$^3$, from about 300 kg/m$^3$ to about 500 kg/m$^3$, from about 350 kg/m$^3$ to about 450 kg/m$^3$, and/or the like. And as discussed above, when the two immiscible or semi-miscible solvents have large differences in surface tensions, in some embodiments, the differences give rise to a shearing force that exfoliates the layers of the trapped crystalline graphite. As an example, one of the two solvents can have a surface tension ranging from about 15 mN/m to about 50 mN/m, and the other of the two solvents can have surface tension ranging from about 50 mN/m to about 100 mN/m. Thus, the difference in surface tension of the two solvents can be in the range of about 0 mN/m to about 85 mN/m, from about 10 mN/m to about 75 mN/m, from about 20 mN/m to about 65 mN/m, from about 30 mN/m to about 60 mN/m, from about 40 mN/m to about 60 mN/m, or from about 45 mN/m to about 55 mN/m.

One example of two immiscible solvents that can be used in the thinning of graphite is water and heptane ($C_7H_{16}$). Under normal conditions (e.g., standard temperature and pressure), heptane has a density of about 680 kg/m$^3$ and water has a density of about 1,000 kg/m$^3$. As immiscible solvents, heptane and water do not mix, and the density differential can result in layers of heptane forming above water, creating an interface for trapping crystalline graphite to be sheared and thinned. Further, under some conditions (e.g., at temperature about 20°), heptane has a surface tension of about 20 mN/m, while water's is a relatively high surface tension of about 73 mN/m, and such large differential can contribute to the shearing of layers off of the ordered crystalline graphite during the wet ball milling process. In some embodiments, the proportional amounts of water and heptane that can be included in these processes can be quite varied. For example, in some embodiments, water and heptane can be included in the first step of the ball milling process in a 1:20 proportion. In some embodiments, the proportions can be about 1:18, about 1:16, about 1:14, about 1:12, about 1:10, about 1:8, about 1:6, about 1:4, about 1:2 or about 1:1, inclusive of all ranges and values therebetween. In other words, the proportions can be in a range from about 1:20 to about 1:1. For example, the water to heptane proportion can be in the range from about 1:18 to about 1:2, from about 1:16 to about 1:4, from about 1:14 to about 1:6, from about 1:12 to about 1:8, etc. In some embodiments, a lower proportion of heptane (e.g., lower than 1:1) can be used, but complications may arise due to issues related to disposal of heptane after usage.

In some embodiments, one or more solvents whose differences in respective densities and/or surface tensions are relatively small can also be used for thinning graphite in wet ball milling processes. For example, a pair of semi-miscible solvents, ethanol and acetonitrile, have comparable densities and surface tensions, i.e., the differences are relatively small. For example, under some conditions (e.g., at temperature about 20°)), ethanol has a density of about 780 kg/m$^3$ and acetonitrile has a density of about 786 kg/m$^3$. In addition, ethanol has a surface tension of about 22 mN/m while acetonitrile has a surface tension of about 19 mN/m. Although ethanol and acetonitrile are semi-miscible and the differences in densities and surface tension are not as high (e.g., compared to water and heptane), in some embodiments, these two solvents are capable of facilitating the thinning of graphite during wet ball milling. In some embodiments, the proportional amounts of ethanol and acetonitrile that can be included in these processes can be quite varied. For example, the volume proportion of ethanol to acetonitrile can range from about 5:1 to about 1:10. In some embodiments, the volume proportion can range from about 4:1 to about 1:8, from about 3:1 to about 1:6, from about 2:1 to about 1:4, from about 1:1 to about 1:3, etc. In some embodiments, the volume proportion can range from about 5:1 to about 5:3, from about 5:3 to about 1:1, from about 1:1 to about 1:3, from about 1:3 to about 1:7, from about 1:7 to about 1:10, etc.

It is to be noted that the above pairs of solvents are exemplary, and other combinations of solvents can be used during the wet ball milling process. In some embodiments, any solvents with sufficient density and/or surface tension differentials can be used during the wet ball milling process. Examples of suitable solvents include, but are not limited to water, ethanol, heptane, acetonitrile, N,N-Dimethylformamide, chlorobenzene, dimethyl sulfoxide, N-methyl-2-pyrrolidinone, 1-propanol, and/or the like can be used as the solvents in the wet ball milling processes.

Figure 2B:
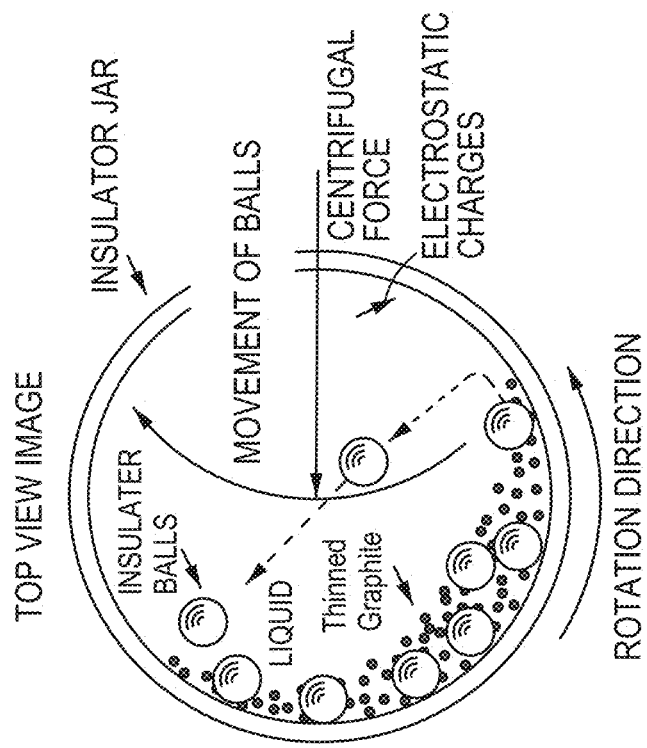
FIGS. 2A and 2B show example schematics of the process of wet ball milling in a ball milling vessel containing graphite, grinding media and a liquid solution, according to an embodiment.
Figure 2A:
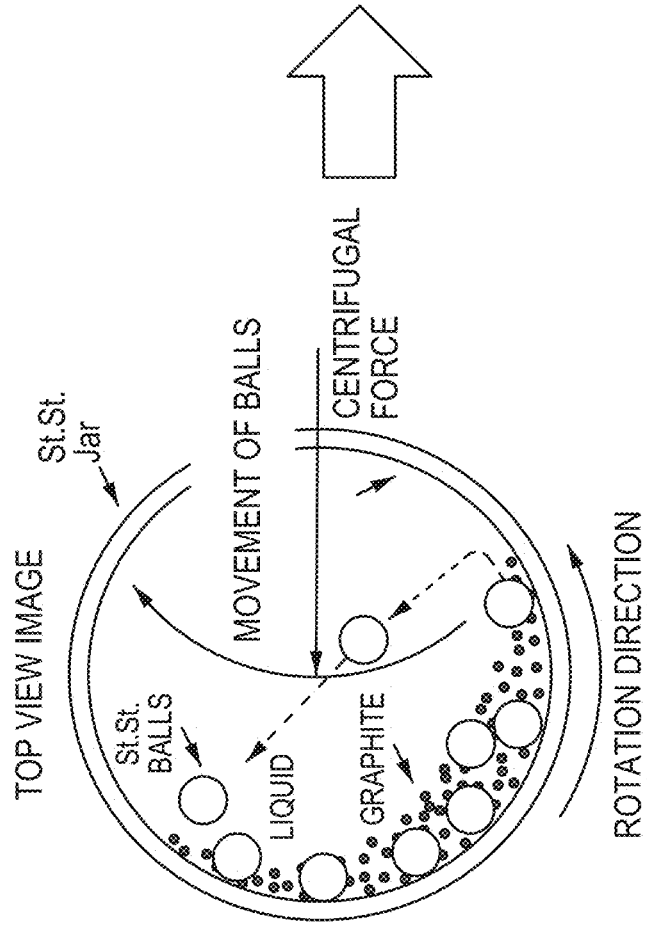

In some embodiments, the crystalline graphite, the one or more solvents, the oxidizer and a grinding media can be placed into a jar to commence the ball milling process. In some embodiments, the ball milling process can be carried out in any type of grinding mill system that comprises a mill jar and allows for the shearing and exfoliation of the crystalline graphite into thinned graphite and/or graphene-graphite composite materials. Examples of grinding mill system that can be used for the ball milling process include mills such as but not limited to ball mills, rod mills, pebble mills, autogenous mills, semi-autogenous mills, roller mills (e.g., jar roller mills, ring mills, frictional-ball mills, etc.), attritors, planetary mills, jet mills, aerodynamic mills, shear mixers, and/or the like. In some embodiments, the mill jars can be made from insulators and/or semi-conductors, including ceramic materials, alumina, stainless steel, and/or zirconia, and can also be lined with materials such as polyurethane, rubber, etc. In some embodiments, the mills include grinding media for aiding in the grinding/shearing of precursor materials such as graphite. In some embodiments, the grinding media can be made from the same type of materials as the mill jar in which the grinding media are being used in. For example, the grinding media can be made from alumina, zirconia, etc. In some embodiments, the grinding media may assume different forms. For example, the grinding media can be at least substantially a ball (hence the term "ball milling"), at least substantially a cylinder, at least substantially a rod, and in fact any shape capable of aiding the grinding/shearing of precursor materials. Example schematics of the ball milling of a ball milling vessel or jar comprising graphite, milling balls, and a solution is shown in FIGS. 2A and 2B.

At step 102, in some embodiments, the mix comprising crystalline graphite, a first solvent, a second solvent and an oxidizer are ball milled by rotating the ball mill containing the mix and milling balls at a relatively low rotational speed. The crystalline graphite can be of any size that can reasonably fit into the mill jar and allow the wet ball milling process to proceed without undue interference by an operator. For example, in some embodiments, the precursor crystalline graphite can have a lateral size of up to about 500 μm. However, in some embodiments, the ball milling process can be carried out efficiently when the grinding media (e.g., the milling balls) are proportional to the crystalline graphite. The proportionality can be in weight, size, volume, density, etc.

In some embodiments, the number of milling balls in the milling jar can depend on milling process related factors such as but not limited to the running time, the rotational speed, amount/size of the crystalline graphite, size of the milling balls (e.g., average size), and/or the like. For example, for a given amount of crystalline graphite, there can be some milling ball sizes (conversely number of milling balls) that can be particularly beneficial in effecting a more efficient shearing of crystalline graphite layers depending on the speed and the length of the ball milling process. For example, at a rotation speed of about 50 rpm and a running time of about 50 hours, the average size of a milling ball in the milling jar can be about 5 mm.

In some embodiments, the precursor crystalline graphite can have a wide range of quality measures with respect to parameters such as defect presence/density (missing particles, displacements, etc.), presence and/or density of extraneous particles, and/or the like. In some embodiments, the precursor material can have pure graphite in the range of from about 40% to about 100% by weight. In some embodiments, the weight percentage of pure graphite in the precursor material can be in a range of from about 50% to about 90%, from about 60% to about 80%, from about 40% to about 60%, from about 60% to about 80%, from about 80% to about 100%. For example, the precursor can have graphite content of about 95% by weight according to some embodiments. In some embodiments, after the wet balling milling process produces thinned graphite and the resulting thinned graphite is washed as described later, the purity of the resulting graphite can be about 99% by weight.

In some embodiments, the mixture may comprise an oxidizing agent in a small amount by volume. For example, the mixture may comprise an oxidizer in the amount of about 1 percent or less by volume, about 3 percent or less by volume, etc. Examples of oxidizing agents include hydrogen peroxide, perchloric acid, nitric acid, and/or the like.

In some embodiments, the speed of the rotation is configured to reduce the initial thickness of graphite material without substantially affecting its lateral size. For example, the stronger mechanical interaction between the milling balls and the crystalline graphite that could result as a result of higher ball milling rotational speed can reduce not only the thickness of the crystalline graphite, but also its lateral size. In some embodiments, the ball milling speed can range from about 10 rotations per minute (rpm) to about 500 rpm. In some embodiments, the ball milling speed can range from about 10 rpm to about 250 rpm, about 10 rpm to about 225 rpm, about 10 rpm to about 150 rpm, about 10 rpm to about 100 rpm, about 25 rpm to about 75 rpm, from about 50 rpm to about 300 rpm, from about 150 rpm to about 250 rpm, and/or the like. In some embodiments, the ball mill may be rotated at a relatively low ball milling rotational speed of about 50 rpm. In some embodiments where the ball mill is rotated at a low speed, it can take several hours before the crystalline graphite is thinned to hundreds of layers. In some embodiments, the ball milling rotation to reduce the thickness of the crystalline graphite (starting from "bulk" thickness of, for example, several micron thickness) to about 400 nm may take from about 2 hours to about 100 hours. In some embodiments, the process can take from about 2 hours to about 48 hours, about 3 hours to about 24 hours, about 6 hours to about 12 hours, and/or the like. For example, rotating at about 50 rpm, it may take about 50 hours to reduce the thickness of a precursor crystalline graphite to about 200 nm thickness.

In some embodiments, the first step of the wet ball milling process may reduce the precursor crystalline graphite to a thickness much less than about 400 nm, for example, about 200 nm. However, such embodiments are usually accompanied with reduction in lateral size of the crystalline graphite, and as such may be avoided when the goal is to obtain thinned graphite that maintain the sheet size of the precursor crystalline graphite.

Figure 3:
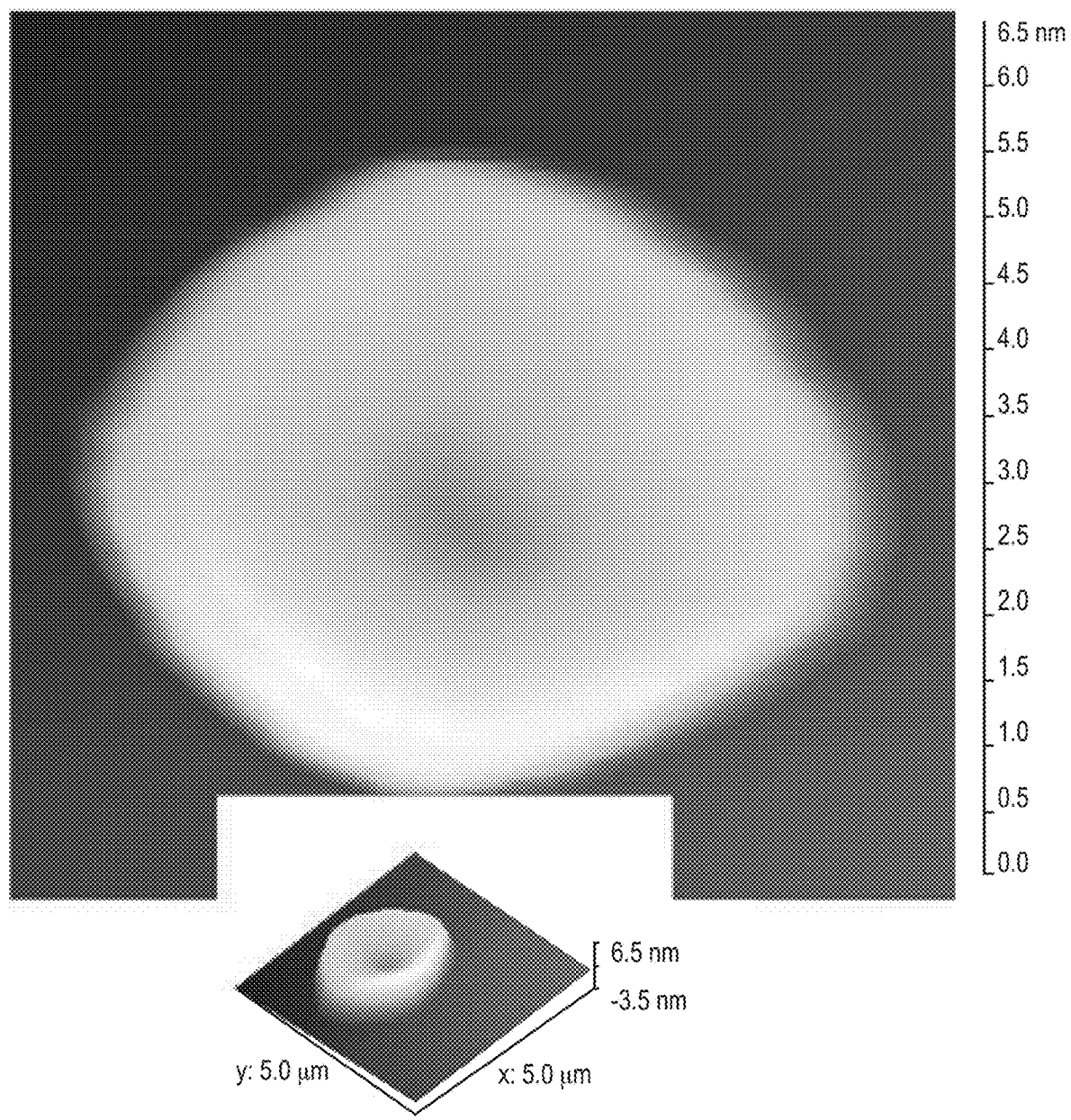
FIG. 3 is an atomic force microscopy image of thinned crystalline graphite produced via a wet ball milling process, according to an embodiment.

At step 103, in some embodiments, the thinned crystalline graphite can be isolated from the other ingredients used after the first step of the wet ball milling process. For example, the solvents and the oxidizer can be drained out of the ball milling jar, leaving behind at least the thinned graphite. In some embodiments, the isolation can take place by transferring some or all of the thinned graphite to another ball milling jar. In such embodiments, the ball milling jar and the grinding media to be included in the jar can be the same, substantially similar or different than those used in the first step of the wet ball milling process. An example end product of the wet ball-milling process as disclosed herein is shown in FIG. 3. The figure shows an atomic force microscopy image of a thinned graphite of about 35 graphene layers produced as a result of the first step of the ball milling process.

At step 104, in some embodiments, one or more solvents for the second step of the wet ball milling process can be added into the milling jar. In some embodiments, the criteria for selecting the solvent can include the same or similar conditions used to select the solvents for the first step of the wet ball milling process. For example, the solvents can have different density and/or surface tension values so as to trap the thinned graphite in between the solvents and aid with the further shearing of the thinned graphite. In addition, at least one of the one or more solvents can be capable of penetrating between layers of the thinned graphite, contributing to the weakening of the interlayer van der Waals bonds and the intercalation and exfoliation of graphite. In some embodiments, the one or more solvents can comprise an organic solvent configured to facilitate the production of electrostatic charges during the wet ball milling of the thinned graphite, which contribute to the exfoliation of the already thinned graphite as will be discussed below.

In some embodiments, the one or more solvents for use during the second step of the wet ball milling process can comprise a non-polar solvent such as water and a polar solvent such as the organic solvent acetonitrile. It is to be noted that the above pairs of solvents are exemplary, and other combinations of solvents can be used during the wet ball milling process. For example, a selection of a polar solvent and a non-polar solvent from the list comprising water, heptane, N,N-Dimethylformamide, acetonitrile, ethanol, chlorobenzene, dimethyl sulfoxide, N-methyl-2-pyrrolidinone, 1-propanol, and/or the like can be used as the solvents for use in the second step of the wet ball milling process.

In some embodiments, a metal hydroxide salt configured to interact with electrostatic charges to produce metal and hydroxide ions can be added into the milling jar of the second step of the wet ball milling process. For example, a metal hydroxide such as KOH may interact with the electrostatic charges produced during the wet ball milling process and release a hydroxyl (OH$^-$) ion which, as will be discussed below can contribute to the production of oxygen atoms that intercalate graphite and lead to exfoliation of graphitic layers. Metal hydroxides comprising metals selected from alkali metals, alkaline earth metals, boron group elements, etc., and hydroxyl ion can be used for such processes. For example, hydroxides of Li, Na, K, Cs, Be, Mg, Ca, Sr, Ba, B, Al, Ga, In, and Ti, and mixtures thereof, can be used as metal hydroxide salts during the second step of the wet ball milling process. In some embodiments, the amount of metal hydroxide salt to be used in the wet ball milling process can assume a wide range of values. For example, considering the solution comprising the solvents and the hydroxide salt, the hydroxide salt can be from about 2% to about 50% of the solution by volume. In some embodiments, for high yield production (e.g., greater than about 60% of the treated precursor graphite powder reduces to FLG, i.e., to about a thinned graphite of 10 layers or less), metals hydroxides comprising alkali and/or alkaline earth metals can be used, while for low yield production, metals hydroxides comprising metals from boron group elements can be used. In some embodiments, in particular for the purpose of doping resulting graphene sheets with metal particles, the amount of metal hydroxide can be increased to about 90% of the solution by volume.

In some embodiments, an oxidizing agent (i.e., oxidizer) can be used in the second step of the ball milling process to, amongst other things, interact with hydroxyl ions to generate atomic oxygen that can intercalate graphite and weaken the interlayer van der Waals bonds. In some embodiments, the oxidizer is also configured to oxidize edges of graphite, paving the way for the formation of graphene-graphite composites. An example of such an oxidizer is hydrogen peroxide ($H_2O_2$). In some embodiments, the oxidizer can be used in a small amount. For example, the mixture in the milling jar comprising the one or more solvents, the thinned graphite, the metal hydroxide salt, and other components such as surfactants and the like may comprise hydrogen peroxide in the amount of about 1 percent or less by volume. In some embodiments, the amount of hydrogen peroxide may be about 3 percent by volume or less.

In some embodiments, surfactants can be included in the wet ball milling process to avoid or minimize clamping of the end products of the ball milling process. Surfactants increase the conductivity of the mixture in the milling jar, allowing for an increased diffusion of the hydroxyl ions and thereby contributing to the exfoliation of layers of the crystalline graphite. Further, surfactants enhance the shearing force imparted on crystalline graphite (e.g. precursor or thinned) as a result of the incongruity of the surface tensions of the one or more solvents used during ball milling processes. The enhancement in the shearing force further contributes to the further thinning of the thinned crystalline graphite by, for example, exfoliation. Examples of surfactants that can be used during wet ball milling processes (e.g., the second step and/or the first step) comprise sodium dodecyl sulfate (SDS), pyridinium (PY+), thionin acetate salt, triton, etc., and mixtures thereof.

In some embodiments, the concentration of surfactants to be used during the wet ball milling processes can be determined based on the desire to maintain balance between the thinning and the reduction in lateral size of the crystalline graphite. As discussed above, in some embodiments, surfactants enhance the shearing force on crystalline graphite and facilitate the thinning of the crystalline graphite. On the other hand, a large amount of surfactants (e.g., more than the amount used to avoid or minimize agglomeration of crystalline graphite) can lead to reduction in lateral size, which may be undesirable in some circumstances. Accordingly, in some embodiments, an average concentration of between about 10 µMolar and about 100 µMolar of surfactants can be used during wet ball milling process to thin crystalline graphite into thinned and/or single or few layers of graphene sheets.

At step 105, in some embodiments, a mixture comprising the thinned graphite, solvents (e.g., polar and non-polar), the metal hydroxide salt, the oxidizer, and surfactants is ball milled in the milling jar for a large scale synthesis of thinned graphite and/or graphene-graphite composites. Depending on the goal for the end product of the wet ball milling process (e.g., thinned graphite, thinned graphene-graphite composite, final thickness, final purity, etc.), in some embodiments, the rotation speed and/or the milling period can be adjusted. For example, to further thin the thinned graphite, the milling jar may be rotated at a relatively low speed for an extended period of time in a manner similar to the first step of the wet ball milling process. For example, the ball milling can be performed at a speed of about or lower than about 50 rpm for a period ranging from about 2 hours to about 100 hours, from about 3 hours to about 50 hours, from about 3 hours to about 24 hours, etc.

In some embodiments, the goal for the wet ball milling process may be to obtain thinned graphene-graphite composite, and in such embodiments, the speed of rotation can be raised to higher ranges. For example, the speed of rotation can be increased to the range from about 50 rpm to about 225 rpm, from about 100 rpm to about 200 rpm, from about 150 rpm to about 175 rpm, etc. Further, the rotation time length can be decreased to a shorter period. For example, the period of rotation can be in the range of from about 1 hour to about 6 hours. In some instances, the period may be in the range of from about 2 hours to about 4 hours.

In some embodiments, the ball milling of the aforementioned mixture generates electrostatic charge that contributes to the exfoliation of layers from the crystalline graphite (already thinned or otherwise). For example, the generated electrostatic charge can initially appear on the surface of the milling balls and/or on the inner parts of the milling jars. In some embodiments, the electrostatic charge remains localized until the conductivity of the mixture attains a threshold that allows the charge to diffuse through the mixture. The conductivity of the mixture can be affected by several factors including the presence and concentration of the organic solvent. During the process, in some embodiments, the electrostatic charge can transfer through the liquid and ionize the metal hydroxide salt to produce metal cations and hydroxide anions (i.e., hydroxyl). In some embodiments, the production of hydroxide anions can be improved by increasing the milling/rotation speed as higher rotation speed enhances localized electrostatic charges and lead to increases in the concentration of hydroxide anions. However, the increased speed also contributes to reduction in lateral sheet size of the crystalline graphite. For example, increasing the ball milling rotational speed can result into stronger mechanical interaction between the milling balls and the crystalline graphite, resulting in the reduction of graphitic lateral sheet size ((and graphene/thinned graphite sheet size). In such embodiments, the speed of rotation can be determined with a view towards balancing the competing needs for enhanced production of hydroxide anions and the ensuing reduction in lateral sheet size. An example schematics of the ball milling of a ball milling vessel or jar producing electrostatic charges is shown in FIG. 2B.

In some embodiments, upon production of the hydroxide anions during the second step of the wet ball milling process, the anions can diffuse through the mixture and attack edges of the crystalline graphite layers, delaminating the edges and opening paths for the organic solvent to access the interatomic spaces between the layers. In some embodiments, the entering of the organic solvent into the interlayer spacing leads to the weakening of the van der Waals bonds between the graphite layers, and facilitates the shearing of the layers of the crystalline graphite. Further, the hydroxyl ions can interact with the water solvent and/or the oxidizer (e.g., hydrogen peroxide) to produce atomic oxygen that can serve as an exfoliating agent. For example, the oxygen can intercalate graphite and expand the interlayer separation, thereby weakening the van der Waals bonds in between the graphene layers. Once the shearing force from the wet ball milling process exceeds the van der Waals force, in some embodiments, exfoliation of layers of graphene takes places, resulting in the thinning of the crystalline graphite and/or production of graphene layers. For example, the exfoliation process described herein can further reduce the thickness of a thinned graphite (e.g., a large lateral-sized (e.g., about 500 µm) crystalline graphite thinned to about 400 nm during the first step of the wet ball milling process) from about 400 nm thinness to a thickness in the range from about 200 nm to about 400 nm. In some embodiments, such reduction in thickness can be obtained without a substantial reduction in lateral (in-plane) size of the thinned graphite, depending on factors such as the rotation speed of the milling process, etc., resulting in an increase in the aspect ratio indicating an efficient process and a high quality product. In some embodiments, further ball milling can reduce the thickness of the graphite to an even lower thickness of few layers of graphene. For example, the thickness can decrease to the range of about 1 nm to about 5 nm (corresponding to from about 3 layers of graphene to about 15 layers). However, in some embodiments, such a process may also reduce the lateral size of the thinned graphite to about several microns (for example, down from about 500 µm lateral size). In some embodiments, the graphite thickness can be further reduced to even fewer layers of a single or two layers of graphene (e.g., less than about 1 nm). In some embodiments, the lateral seize can decrease to about 300 nm. In some embodiments, the aspect ratio may not change as much, or even increase, indicating that the reduction in thickness may have been obtained at the cost of reduced flake size.

In some embodiments, the diffusion process of the anions can be proportional to the density of the electrostatic charges in the milling jar and correlate with the ionization voltage and production yield of exfoliated graphene or thinned graphite. Further, diffusion length of hydroxide anions can be dependent upon organic solvent concentration, presence and/or concentration of an oxidizer, quality and/or purity of the precursor crystalline graphite, etc.

Exfoliation of crystalline graphite with the aid of electrostatic charges is advantageous in that large quantities of large graphene and/or thinned graphite sheets can be produced at a relatively quick pace using an environmentally friendly process that does not used strong acids and/or release noxious gases. In some embodiments, the wet ball milling process of the present disclosure may be carried out at temperatures that avoid the loss of solvents in the mixture (e.g., water). For example, the process can take place at room temperature. Further, in some embodiments, the resulting graphitic product contains little or no defects (because of absence of strong acids and/or large mechanical forces, for example), and can be highly dispersive during applications as a result of the functionalized edge structures. For example, hydroxylated graphene can have better dispersibility in aqueous solutions and could be more amenable to mixing with metals and/or metal oxides.

In some embodiments, the resulting graphene and/or thinned graphite can be edge functionalized with the hydroxyl ions which facilitate the dispersion of graphene and/or thinned graphite in metals, ceramics, some polymers, etc., during applications. For example, further milling and/or low concentration of the oxidizer can result in saturated electrostatic charges accumulating on the surface of graphite particles and on the edges of graphene, and such charges allow for the functionalization of graphene and/or thinned graphite edges by bonding with hydroxyl ions and/or process by products such as but not limited to hydrogen atoms. The functionalization of graphene and/or thinned graphite has several useful properties. For example, in some embodiments, the appearance of hydroxyl ions on the edge of graphene and/or thinned graphite can increase the thermal stability of the processed product. In some embodiments, the formation of graphite-graphene composites follows from the activation or functionalization of the edges as activated edges have a large tendency to covalently bond with the surface of graphite particles, resulting in the formation of graphite-graphene composites in which graphene is bonded covalently with graphite rather than via van der Waals bonds. FIG. 4 shows an example scanning electron microscopy image of graphene-graphite composite produced as a result of the second step of the ball milling process.

Figure 5:
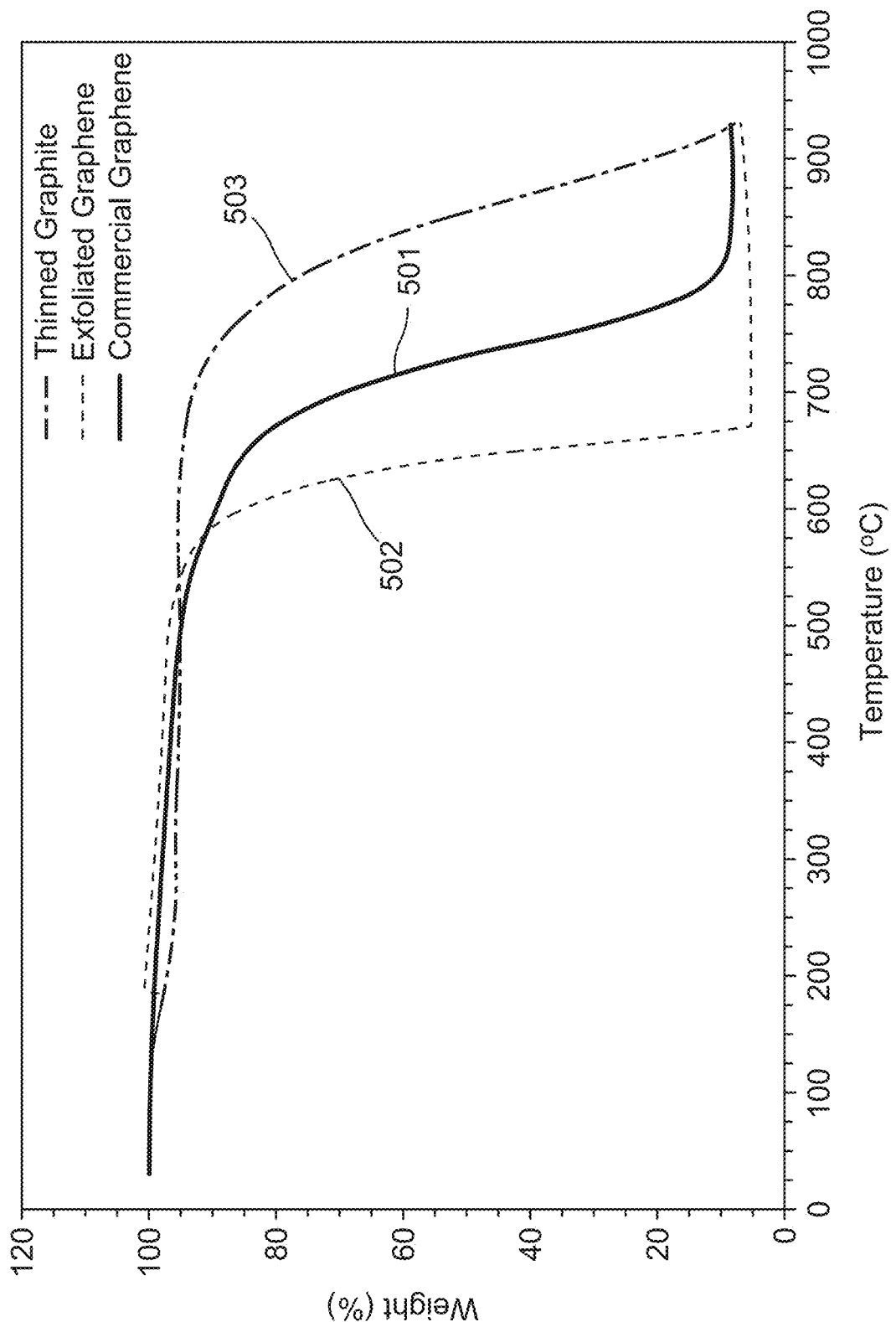
FIG. 5 is a plot of thermogravimetric analysis illustrating the thermal stability of commercial graphene, exfoliated graphene, and thinned graphite produced via a wet ball milling process, according to an embodiment.
Figure 6:
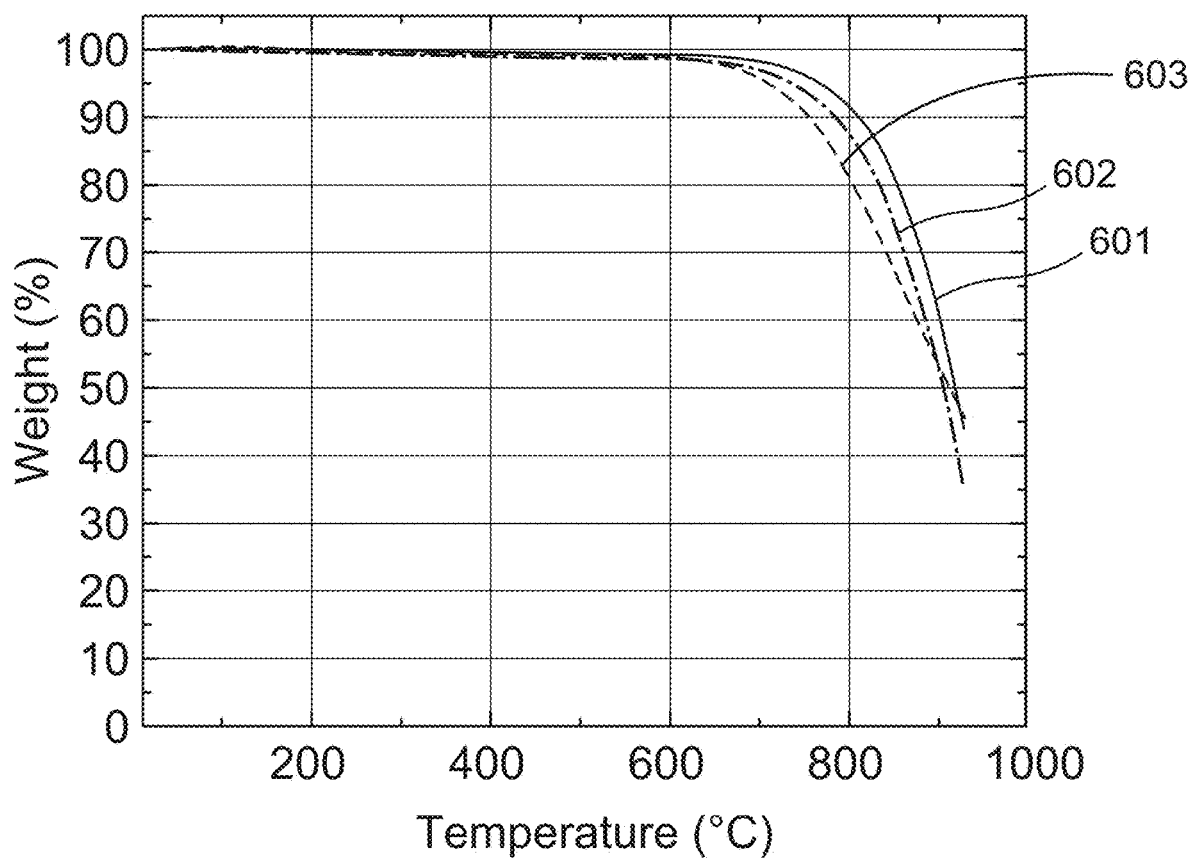
FIG. 6 is a plot of thermogravimetric analysis illustrating the thermal stability of natural graphene, graphite and a graphene-graphite composite produced via a wet ball milling process, according to some embodiments.

In some embodiments, the appearance of hydroxyl ions on the edge of graphene and/or thinned graphite can increase the thermal stability of the processed product. For example, FIG. 5 shows results of a thermogravimetric analysis profiling the thermal stability of commercial graphene 501, exfoliated graphene 502 and thinned graphite 503 (thinned according to the processes disclosed herein). Compared to commercial graphene, FIG. 5 shows that thinned graphite 503 of the present disclosure has a higher thermal stability and hence decomposes at a higher temperature. Similarly, FIG. 6 shows the thermogravimetric analysis profiling the thermal stability of natural graphene 601, thinned graphite 602 and thinned graphene-graphite composite 603. The figure shows that the graphene-graphite composite 603 has a higher stability than natural graphite 601 and decomposes at a higher temperature.

Figure 7:
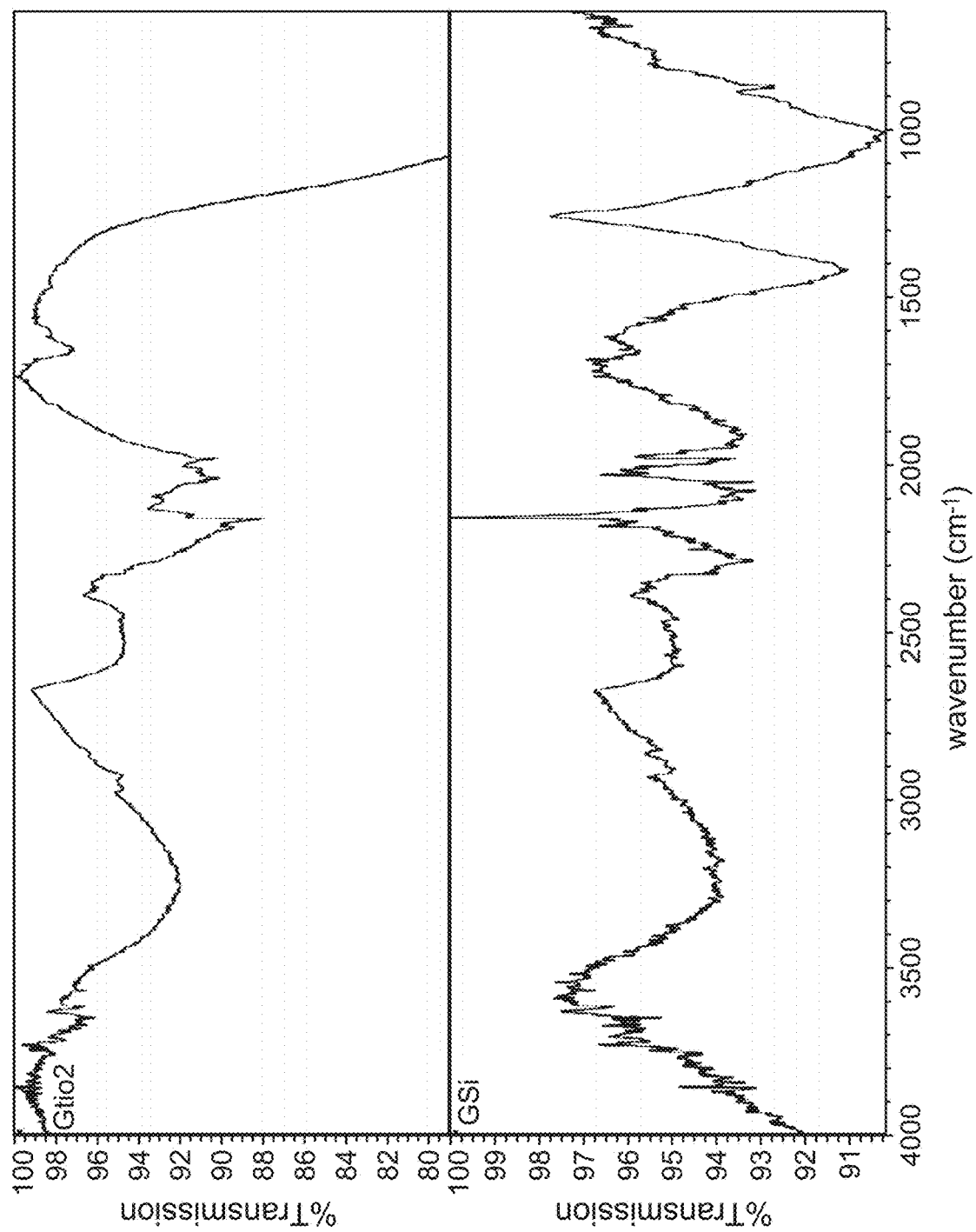
FIG. 7 are plots of Fourier transform infrared spectroscopy of silicon-graphene (top panel) and titanium dioxide-graphene (bottom panel) composites representing a high degree of dispersion, according to an embodiment.

In some embodiments, the functionalized graphene and/or thinned graphite are capable of dispersing into metals and/or oxides to form metal or oxide composites that have several useful properties for applications. For example, such graphene and/or thinned graphite can be mixed with metals such as silicon, titanium, copper, etc., to produce graphene-metal composites that have high thermal conductivity, and as such can be suitable for applications such as in cooling systems, etc. As another example, such graphene and/or thinned graphite can be mixed with metal oxides such as but not limited to titanium oxides and titanium dioxides to produce graphene-metal oxide composites with improved thermal and/or electrical conductivities. FIG. 7 shows plots of Fourier transform infrared spectroscopy of silicon-graphene (top panel) and titanium dioxide-graphene (bottom panel) composites representing a high degree of dispersion.

In some embodiments, higher concentration of the oxidizer can lead to rapid delamination and/or oxidation of graphite edges and the thinning of graphite (or conversion of graphite into graphene). Further, extra metal hydroxide salt can increase the conductivity of the mixture, allowing for a faster rate of graphite thinning and/or graphite-graphene composite formation. However, it can also lead to higher concentration of hydrogen by-products and higher risk of explosion inside the jars. As such, gentle forces and good control of the chemistry of the mixture and the electrostatic charge formation, such as careful ventilation of gasses inside the jar using safety valves, etc., can be beneficial in increasing the safety of the wet ball milling process, in particular for large scale processes.

In some embodiments, once the final product of single layers of graphene, thinned graphite, graphene-graphite composites, and/or the like is obtained, post-processing washing can remove by-products or residues to increase quality of the product. For example, diluted/weak acid washing and drying can remove metallic ions, surfactants, metal salts, etc., from single and/or few layer graphene and render the product suitable for several applications where high purity graphene is needed such as but not limited to solar cells, Li-ion batteries, supercapacitors, flexible displays, etc. For example, the washing could be performed with water, HCl, ethanol, etc., followed by vacuum filtration, centrifugation, sonication, vacuum drying, etc. In some embodiments, the result could be a high-purity thinned graphite/graphene (e.g., 99% purity by weight) with little or no crystalline imperfection, and/or high thermal stability, allowing the use of such products in a wide range of applications including battery applications such as alkaline batteries, natural additives in fire retardant applications, lubrication applications, and/or the like. In some embodiments, the exfoliated graphite/graphene product can be mixed with metals such as but not limited to titanium, copper, and silicon to improve the thermal conductivity of the end product. Further, it can also be mixed with metal oxides such as but not limited to titanium dioxide to improve the product's thermal conductivity and electrical conductivity.

Experimental Characterization of Thinned Graphite and Few-Layer Graphene

Some embodiments of the wet ball milling process disclosed herein have been employed to produce thinned graphite, few-layer graphene (FLG), graphene-graphite composites, and/or oxidized few-layer graphene (i.e., graphene partially oxidized (GPO)). Some of the resulting products can be conveniently classified into the following classes or grades:

Grade A: A few-layer graphene powder of about 3 to 4 graphene layers and lateral size (e.g., flake diameter) of about 5 μm to 20 μm. This few-layer graphene has been found to exhibit highly activated edges and low defect density.

Grade B: A few-layer graphene powder of about 2 to 3 graphene layers and lateral size (e.g., flake diameter) of about 0.5 μm to 5 μm. This few-layer graphene has been found to exhibit highly activated edges and low defects.

Grade C: A few-layer graphene powder with similar properties as Grade A, but with moderately activated edges.

Grade D: A few-layer graphene powder with similar properties as Grade B, but with moderately activated edges.

Grade E: A graphite/graphene composite of thinned/few-layer graphene (e.g., similar to Grade B) bonded to larger crystalline graphite.

Grade F: A highly activated few-layer graphene of about 1 to 2 graphene layers and lateral size (e.g., flake diameter) of about 0.2 μm to 0.5 μm. In some embodiments, some of the edge hydroxyl groups have oxidized to form carbonyl groups.

These graphene-based products are suitable for a wide range of applications, including lubricants, coatings, paints, composite materials, thermal management and energy applications. For example, Grade F products are capable of readily dispersing in water and/or organic solvents, making them excellent candidates to replace graphene oxide in many applications. Further, Grade F graphene layers can be suitable for mixing with polymers, paints, lubricants, heat transfer fluids, and/or the like.

In some embodiments, the characterization of the products of the wet ball milling process disclosed herein includes the determination of various physical, chemical, etc., properties of the products. Examples of these properties include lateral size, defect density, thickness, edge activation and extent of reduction of crystalline graphite into graphene layers as measured by, for example, the proportion of graphene (i.e., single layer) to graphite (non-single layers) content.

Figure 8A:
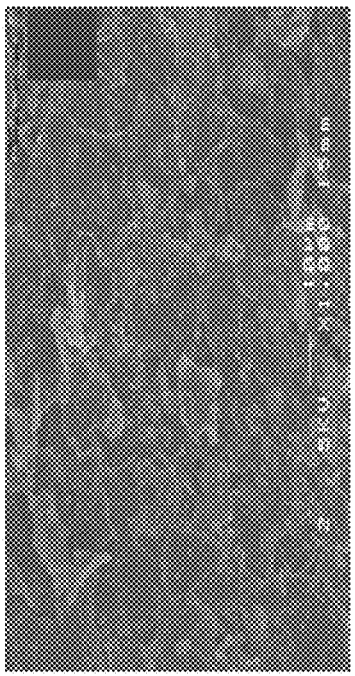
FIGS. 8A-8F are a series of SEM micrographs of a wide variety of few-layer graphene and graphene-graphite composites, according to an embodiment.
Figure 8B:
Figure 8C:
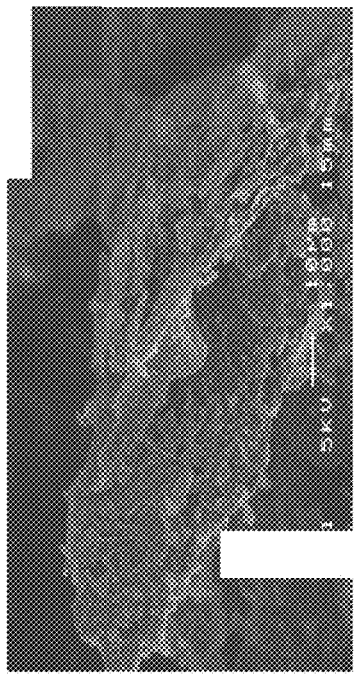
Figure 8D:
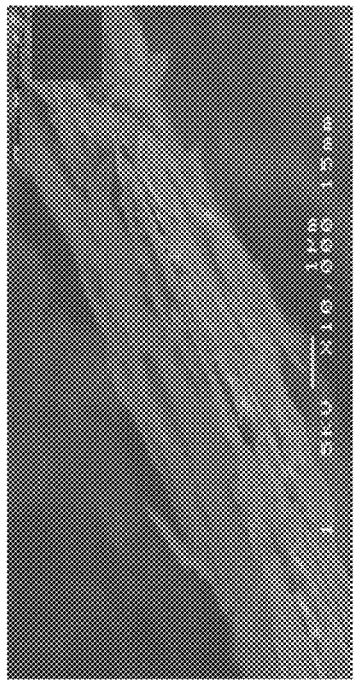
Figure 8E:
Figure 8F:
Figures 9A, 9B:
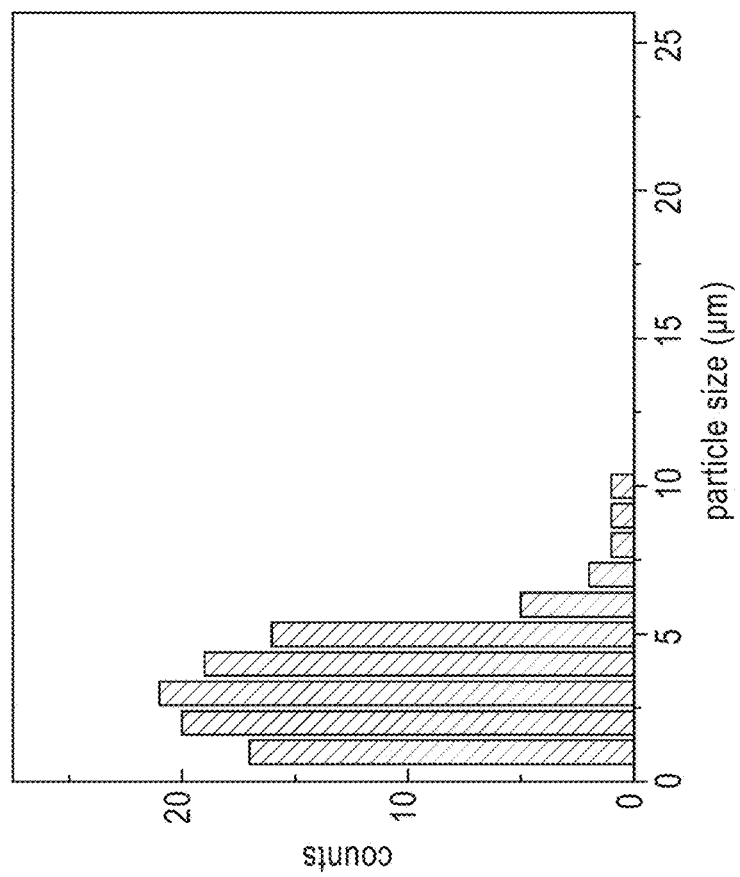
FIGS. 9A and 9B are plots of the lateral size distribution of graphene-based particles that comprise few-layer graphene samples, according to an embodiment.

With respect to lateral size of the graphene-based products, well known experimental techniques such as scanning electron microscopy (SEM) could be used to capture images of the products for analysis. For example, FIG. 8 shows example SEM images of Grade A few-layer graphene (FIG. 8A), Grade B few-layer graphene (FIG. 8C), Grade C few-layer graphene (FIG. 8B), Grade D few-layer graphene (FIG. 8D), and Grade E graphene-graphite composite (FIGS. 8E and 8F). The figures suggest that the FLG of the shown grades comprise flake shaped particles with a distribution of sizes. For example, Grade B FLG are thin layered structures stacked together. An analysis of the SEM images reveal the FLGs of each grade are composed of different sized flakes or particles. For example, Grades A and C have been found to include particles or flakes ranging in lateral size from about 5 μm to about 20 μm (FIG. 9A), Grades B and D include particles ranging in lateral size from about 0.5 μm to about 5 μm (FIG. 9B), and Grade E includes particles ranging in lateral size from about 0.5 μm to about 10 μm.

Figure 10:
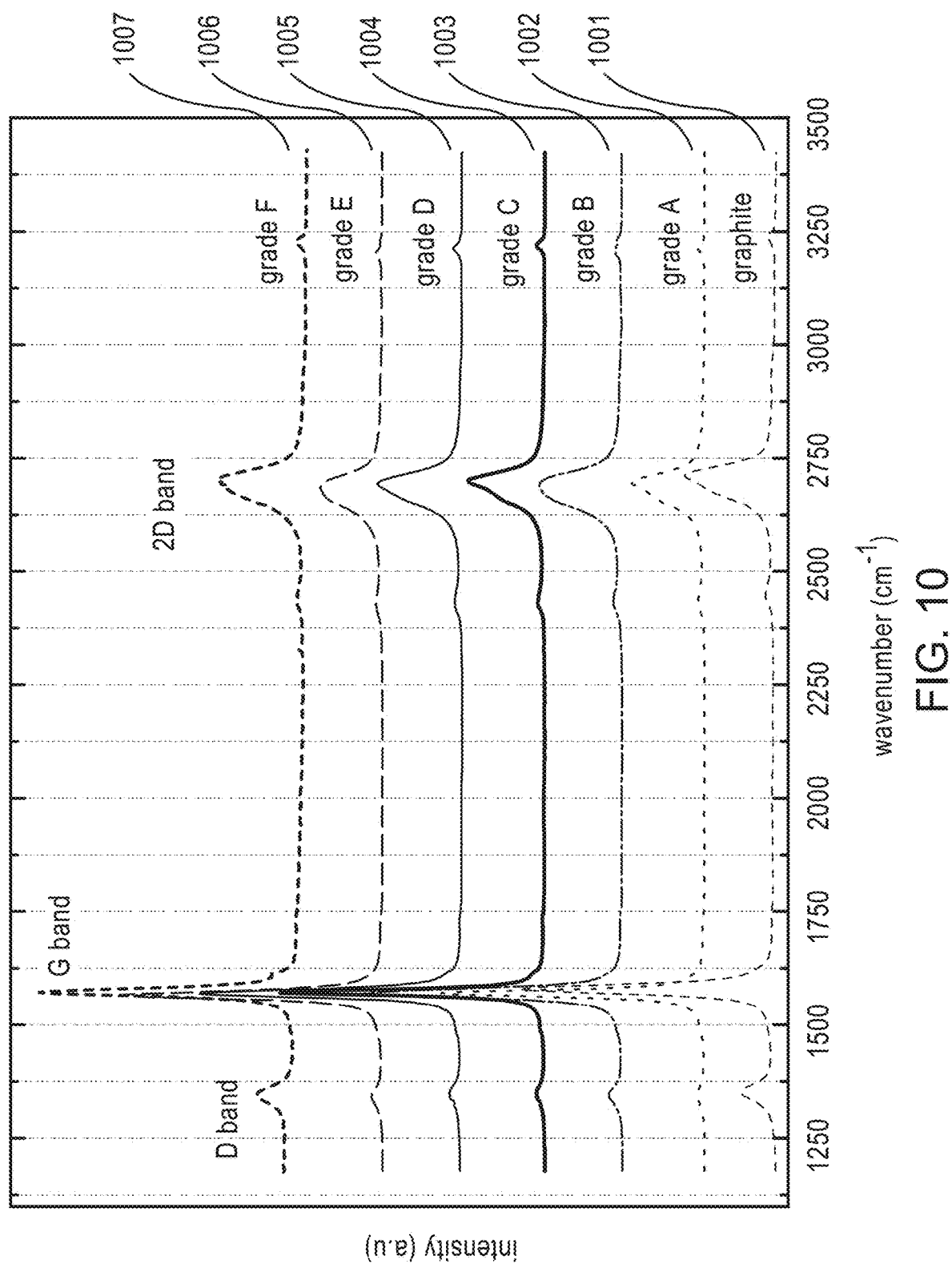
FIG. 10 is a plot of Raman spectra for a series of different few-layer graphene, graphene-graphite composite, and bulk graphite, according to an embodiment.
Figure 11A:
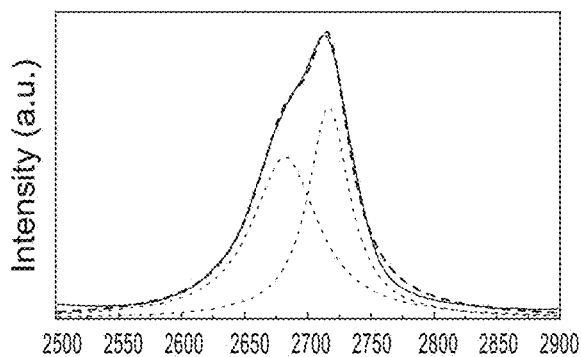
FIGS. 11A-11G are plots showing the two peak deconvolution of the Raman spectra of different few-layer graphene, graphene-graphite composite, and bulk graphite indicating the presence of a plurality of graphene layers, according to an embodiment.
Figure 11B:
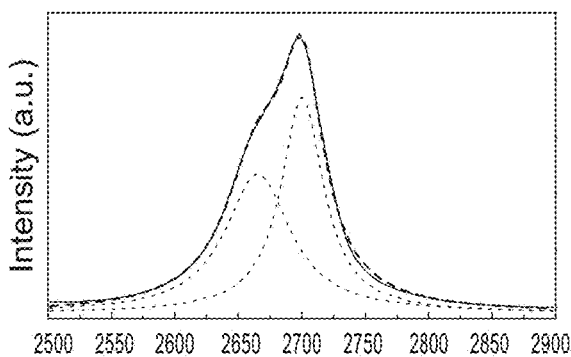
Figure 11C:
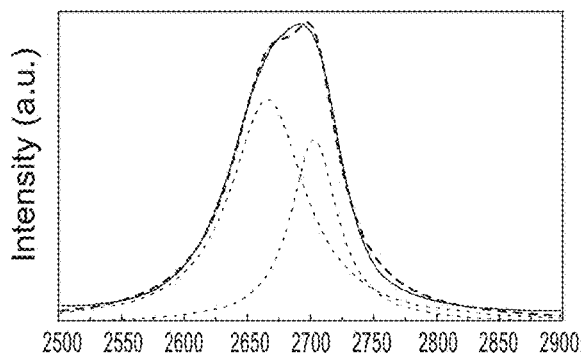
Figure 11D:
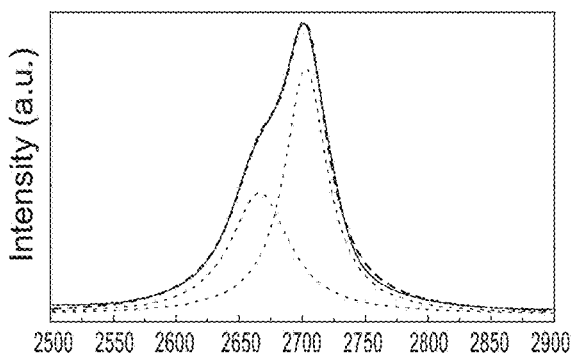
Figure 11E:
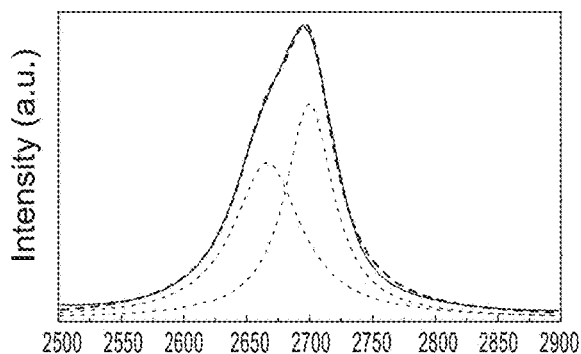
Figure 11F:
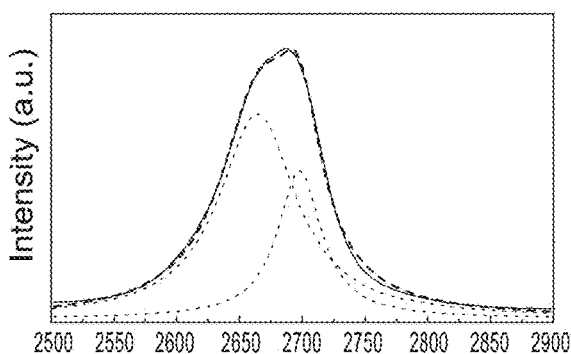
Figure 11G:
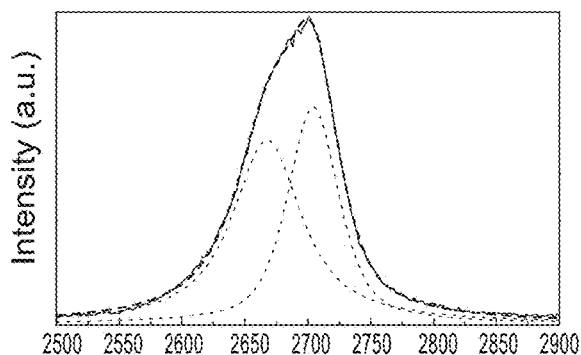

With respect to thickness and defect density of the graphene-based products of the wet ball milling process, in some embodiments, Raman spectroscopy can be used to characterize these properties. For example, in some of the experimental embodiments described herein, visible light (e.g., 532 nm wavelength light corresponding to 2.33 eV energy) have been used to obtain Raman spectra for bulk graphite 1001, Grade A FLG 1002, Grade B FLG 1003, Grade C FLG 1004, Grade D FLG 1005, Grade E graphene-graphite composite 1006, and Grade F activated graphene 1007, all of which are shown in FIG. 10. The Raman spectra for all the grades show peaks that are the result of in-plane vibrational modes caused by excitations due to the laser used for the spectroscopy. These peaks or bands include the primary in-plane mode of the so-called G band around wavenumber 1580 $cm^{-1}$, a different in-plane vibration mode of the so-called D band around wavenumber 1300 $cm^{-1}$, and a second-order overtone of the D band, the so-called 2D band around wavenumber 2700 $cm^{-1}$. In some embodiments, the ratio of the intensity at the G band to the intensity at the D band good indication of the presence of defects in the flakes can be used as a measure of the presence of defects in the graphene-based material being investigated, wherein a small value of the ratio indicating large defect presence and vice versa. From the results of the Raman spectroscopy (FIG. 10), the average value of the ratio for the FLGs of Grades A, B, C, and is calculated to be about 20, a large value indicating low numbers of defects in the FLGs (and further indicating that the FLGs are large-sized).

Figure 12B:
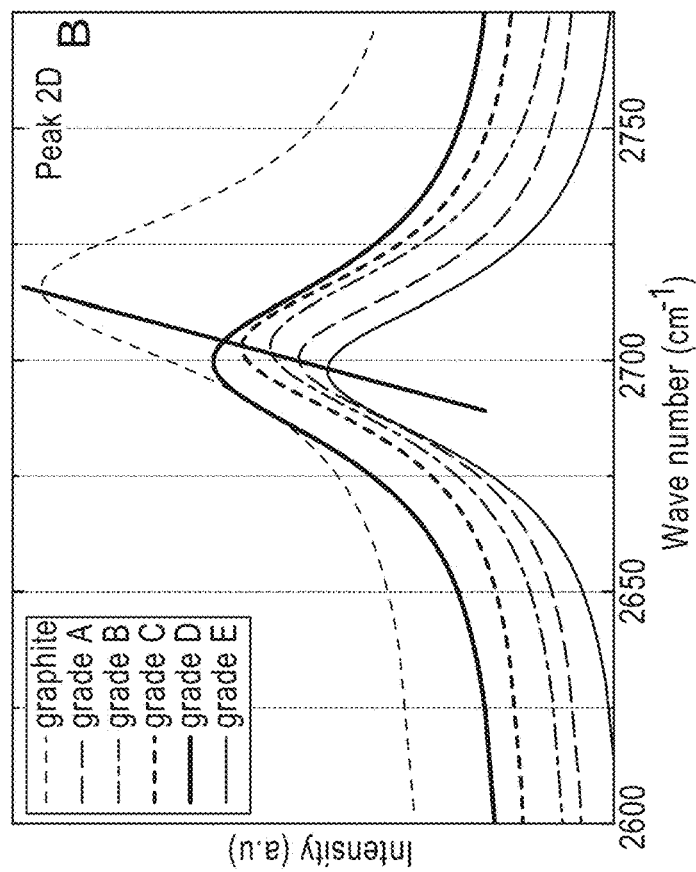
FIGS. 12A and 12B are plots showing the shift of the 2D band peak as a function of the thickness of few-layer graphene samples, according to an embodiment.
Figure 12A:
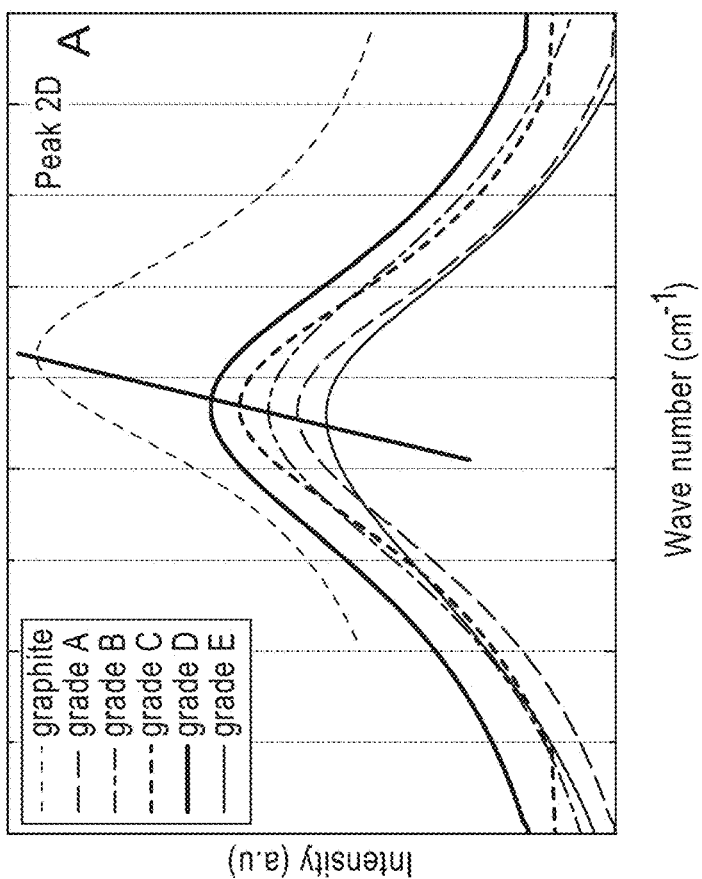
Figure 13:
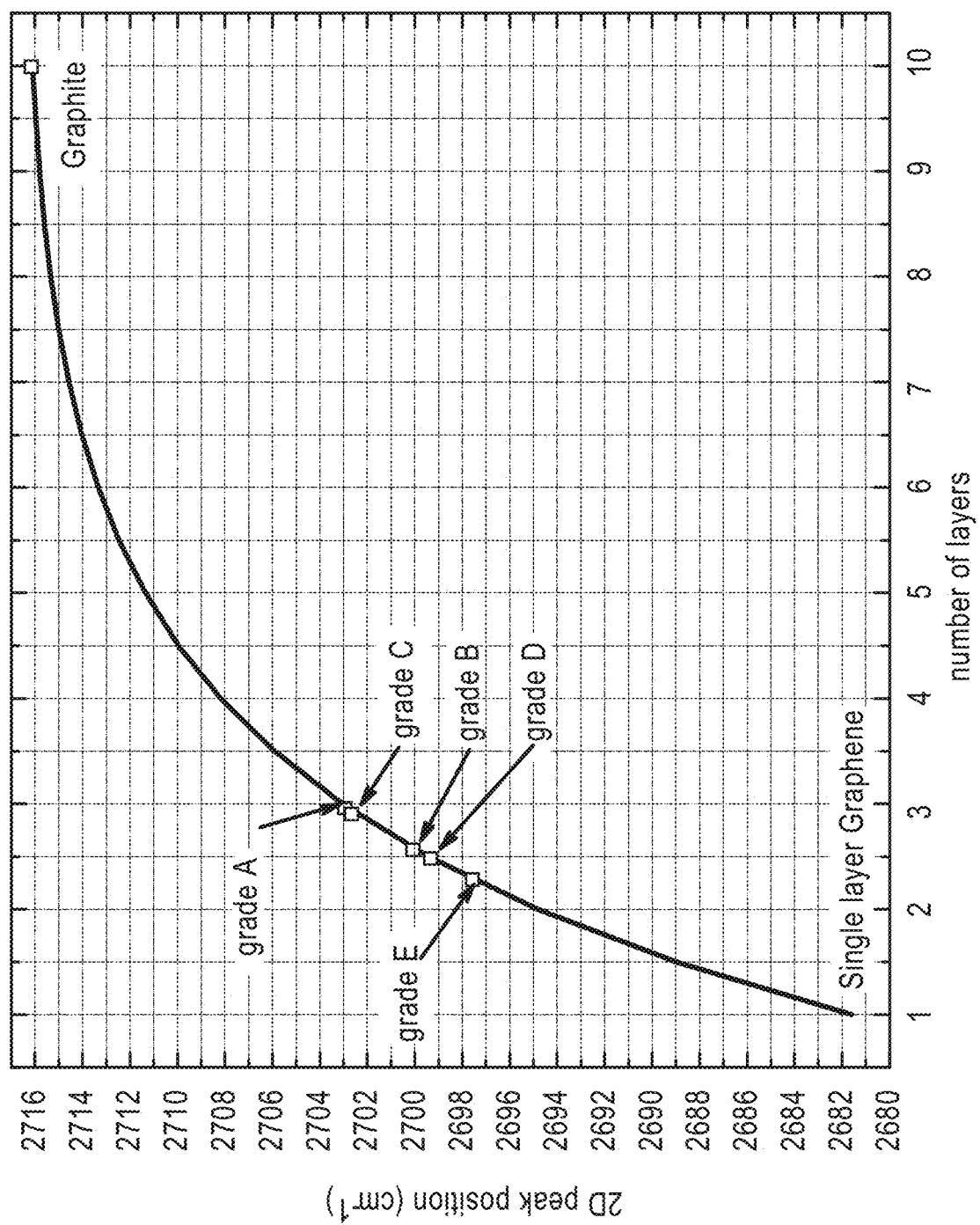
FIG. 13 is alternative plot providing a compact view of the number of layers in few-layer graphene samples and graphene-graphite composites, according to an embodiment.

In some embodiments, the Raman spectra can also be used for determining the number of layers, i.e., the thickness, in a few-layer graphene. For example, as discussed in Phys. Rev. Lett., 97, 187401 (2006), the entire contents of which is incorporated herein by reference in its entirety, the 2D peak of Raman spectra changes in shape, width, and position for an increasing number of layers. As such, the position, for example, of the 2D peak can be used in determining the number of layers. Using the techniques discussed in Journal of Physics: Conference Series 109 (2008) 012008, the entire contents of which is incorporated herein by reference in its entirety, a two peaks deconvolution using Lorentzian functions was chosen. The fact that this two peaks deconvolution was possible, as shown in FIG. 11, indicates that the number of layers was greater than two. A careful analytical comparison of the 2D peaks amongst the different grade FLGs reveals that the 2D peak shifts from a higher wavenumber for crystalline graphite with large number of graphene sheets to a lower wavenumber for few-layer graphene such as Grade E FLGs, as shown in FIGS. 12A-B, Comparison of the 2D peak positions for the different grades with the data provided in Chem. Comm., 2011, 47, 9408-9410, the entire contents of which is incorporated herein by reference in its entirety, allows one to establish the number of layers in the FLGs and graphene-graphite composite of Grades A-E and bulk graphite. FIG. 13 provides a compact view of the number of layers of the FLGs and graphene-graphite composites of Grades A-E and bulk graphite in relation to the 2D peak positions. A tabulation of the 2D peaks and the number of layers for each grade is given below:

| NanoXplore Sample | $2D_A$ peak position | $2D_B$ peak position | Number of layers |
|---|---|---|---|
| Graphite | 2682.03 $cm^{-1}$ | 2716.67 $cm^{-1}$ | >=10 |
| Grade A | 2665.26 $cm^{-1}$ | 2700.34 $cm^{-1}$ | 2 to 3 |
| Grade B | 2666.09 $cm^{-1}$ | 2703.01 $cm^{-1}$ | 4 to 5 |
| Grade C | 2666.28 $cm^{-1}$ | 2702.82 $cm^{-1}$ | 2 to 3 |
| Grade D | 2666.37 $cm^{-1}$ | 2699.72 $cm^{-1}$ | 4 to 5 |
| Grade E | 2664.52 $cm^{-1}$ | 2697.76 $cm^{-1}$ | Some 2 to 3 flakes |

Figure 14:
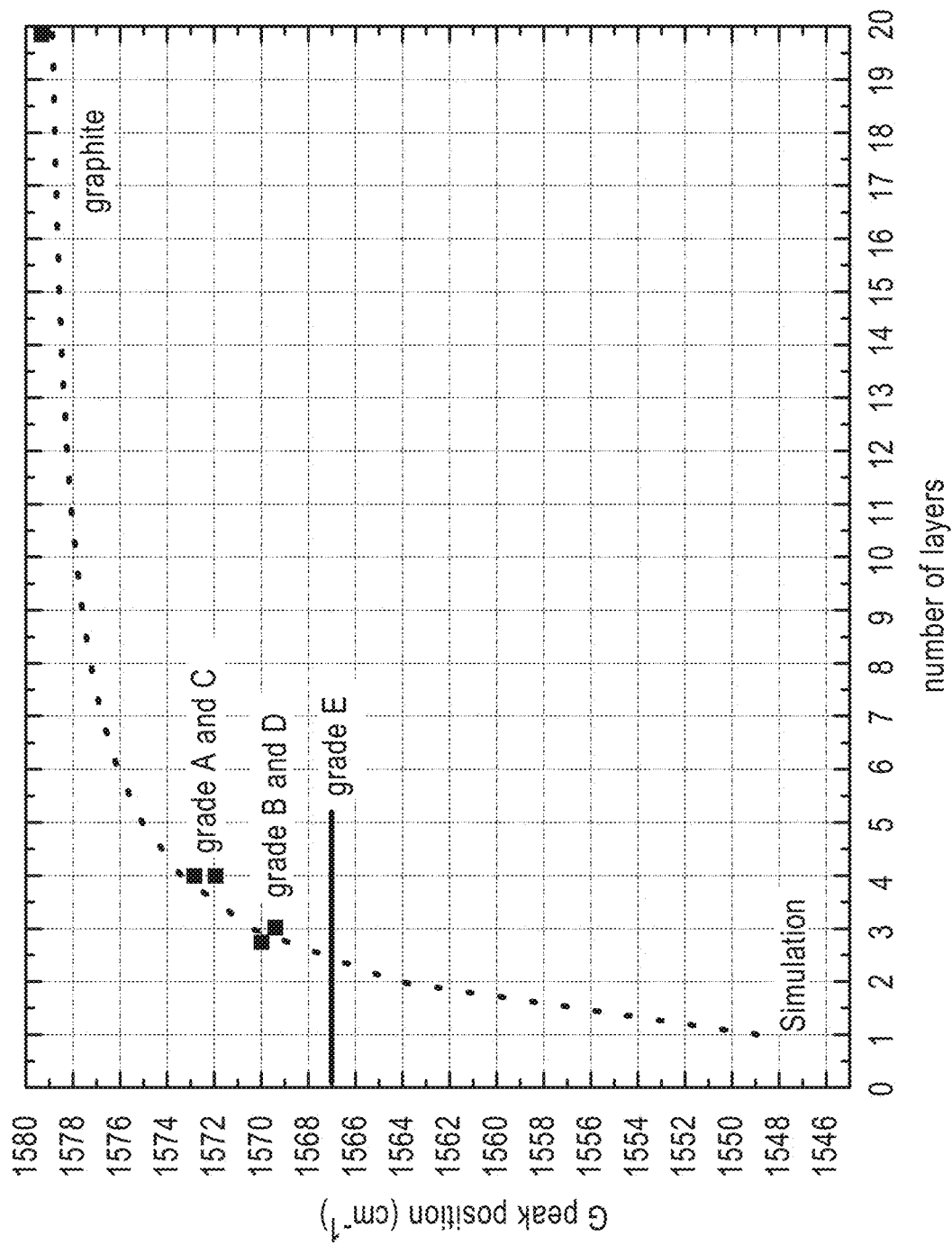
FIG. 14 is a plot showing simulated results of the number of layers in few-layer graphene samples and graphene-graphite composites, according to an embodiment.

In some embodiments, the G peak of the Raman spectra can also be used in evaluating the number of layers in the FLGs and the graphene-graphite composites. According to J. Raman Spectrosc. 2009, 40, 1791-1796, the entire contents of which is incorporated herein by reference in its entirety, an empirical evaluation of the number of layers can also be determined from G peak position using the equation $$N = N_{Graphite} - \frac{K}{1+n^{1.6}}$$

where N is the wavenumber of the G peak of the FLG or graphene-graphite composite, n is the number of layers, $N_{Graphite}$ is the wavenumber of bulk graphite corresponding to large value of n (e.g., n>10), and K a calculated coefficient. Using the wavenumber for the aforementioned G peaks of the Grade A-E FLGs and graphene-graphite composites, and setting the wavenumber of bulk graphite $N_{Graphite}$ to be about 1579.38 $cm^{-1}$, the coefficient K was calculated to be about 54±3. In some embodiments, this method of evaluation gives some coherent results for Grades B, D and E with about 2 to 3 layers; however, in some embodiments, a small difference can be observed for Grades A and B indicating up to 4 layers (e.g., instead of 3). FIG. 14 provides calculated values for the number of layers of the FLGs and graphene-graphite composites of Grades A-E and bulk graphite in relation to the G peak positions. In view of experimental and/or simulation errors that occur in the above two methods of determining the number of layers in samples of Grades A-E, in some embodiments, a reasonable determination of about 2-3 layers for Grades B, D and E and about 3-4 for Grades A and C can be made.

In some embodiments, the wet ball milling processes disclosed herein are capable of producing thinned graphite (including FLGs) that are edge activated. For example, activation of thinned graphite edges leads to appearance of hydroxyl groups ($OH^-$) at the edges that serve as chemical "hooks" for the FLGs and composites of Grade A, B, C, D and E in various amounts. X-ray Photon Spectroscopy (XPS) has been used to characterize the surfaces and identify the hydroxyl groups of the graphene-based products of Grades A, B, C, D, E and F. FIG. 15 shows the XPS spectra of Grade A (FIG. 15A), Grade B (FIG. 15B), Grade C (FIG. 15C), Grade D (FIG. 15D), Grade E (FIG. 15E) and Grade F (FIG. 15F) with some of the peaks corresponding to the atomic orbitals identified. Deconvolution was performed to semi-quantify the carbon species on the surface where the same pattern was used for all five grades. Four intensity peaks were identified:

Peak from carbon $sp^2$ due to graphitic carbon. It can be seen that this peak is the most intense because graphene is composed of a vast majority of carbon atoms in $sp^2$.

Peak from carbon $sp^3$ due to tetrahedral bonded carbon. This carbon species can be found on the edges of the graphene platelets.

Peak from carbon-oxygen (C—O) is due to the hydroxyl groups on the edges of graphene platelets. This shows that the wet ball milling process is capable of effectively functionalizing graphene platelets edges.

Peaks from π-π are typical of graphitic carbon and can be attributed to resonance. The presence can be expected in graphene because this is a graphitic material.

Integrals. i.e., summation of the intensities of each peak for each grade are tabulated below, indicating that all six grades comprise activated edges with hydroxyl groups.

|  | C1s sp3 | C1s sp2 | C1s C—O | C1s C=O | C1s π-π * |
|---|---|---|---|---|---|
| Grade A | 10.19 | 58.85 | 22.84 | 0 | 8.12 |
| Grade B | 9.23 | 61.71 | 18.54 | 0 | 10.51 |
| Grade C | 9.63 | 61.84 | 22.61 | 0 | 5.92 |
| Grade D | 10.01 | 61.95 | 21.21 | 0 | 6.84 |
| Grade E | 8.49 | 59.54 | 23.69 | 0 | 8.28 |
| Grade F | 14.69 | 53.19 | 17.2 | 3.94 | 10.98 |

Figure 15A:
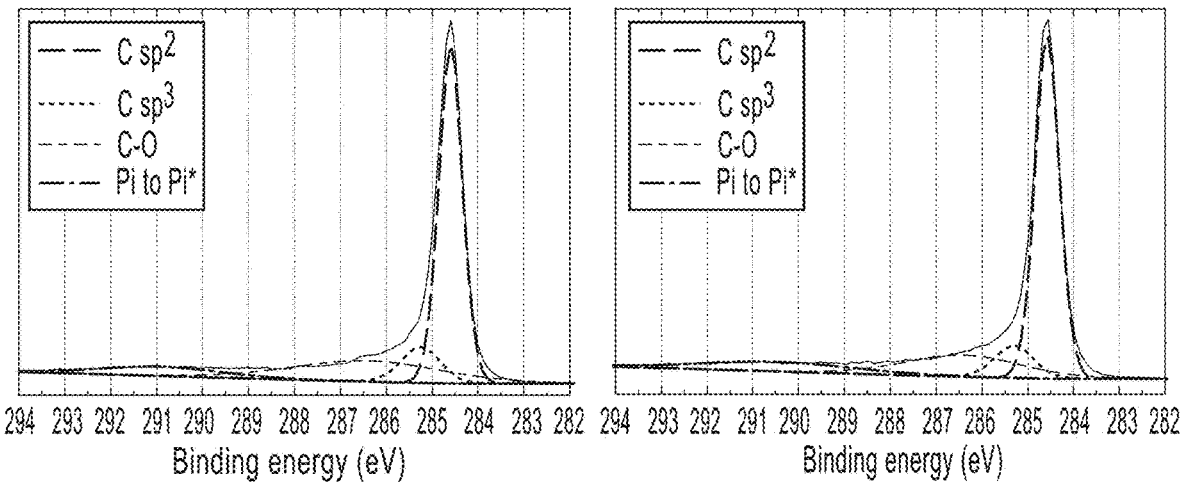
FIG. 15 is an example plot of X-ray photon spectroscopy (XPS) spectra for a series of different few-layer graphene, graphene-graphite composite and bulk graphite, according to an embodiment.
Figure 15B:
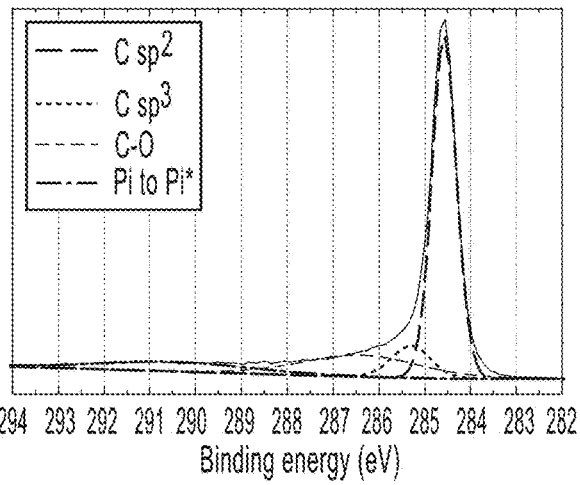
Figure 15C:
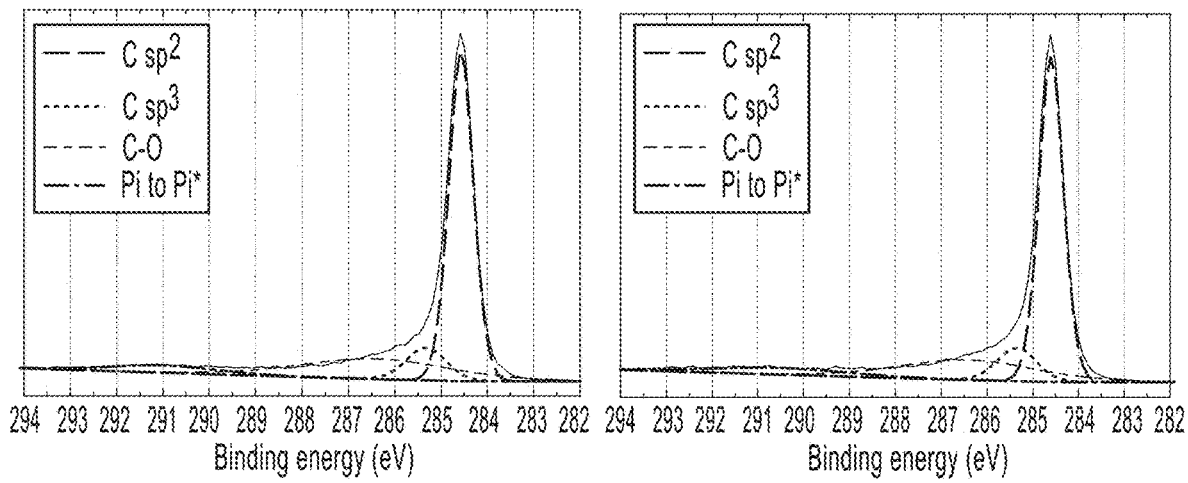
Figure 15D:
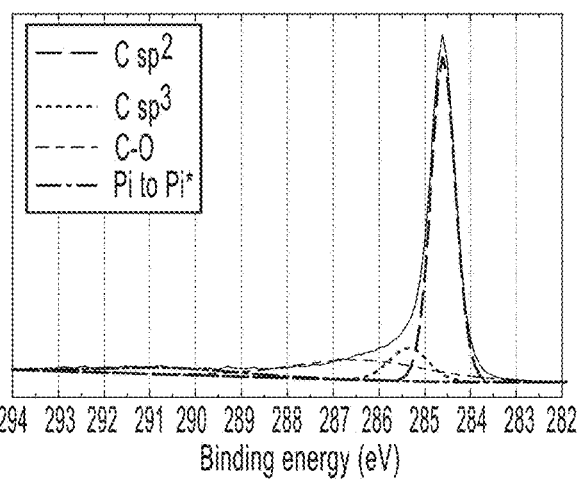
Figure 15E:
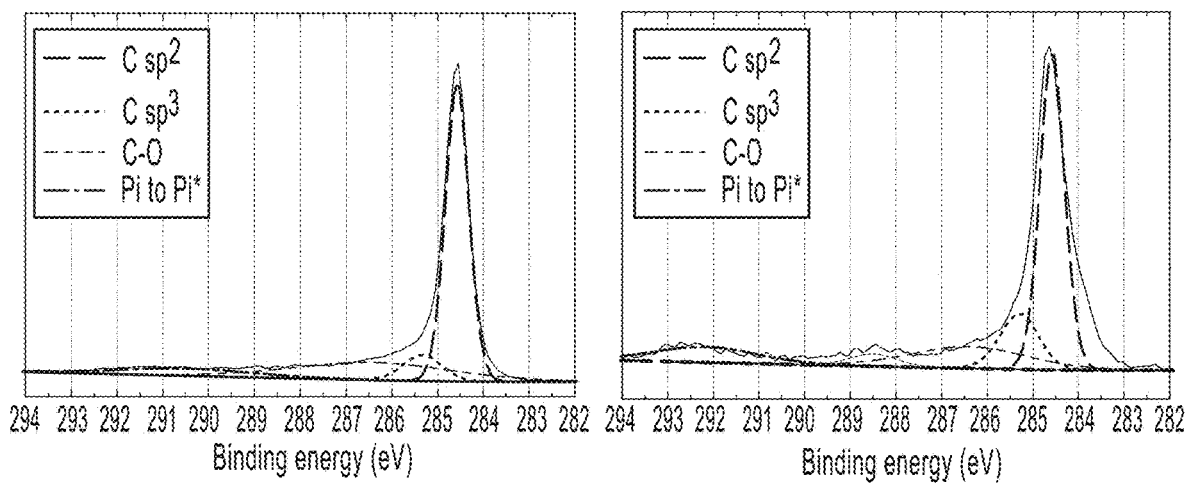
Figure 15F:
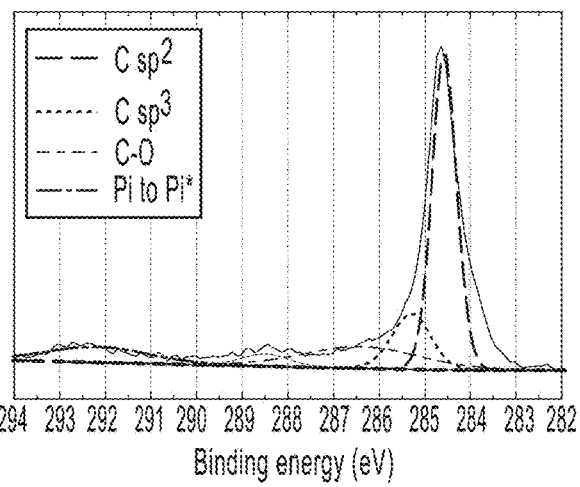

FIG. 15F shows the deconvoluted XPS Carbon 1s spectra of Grade F. The main difference from Grade D is the emergence of a new peak around 287.5 eV that can be attributed to carbonyl. Quantification based on integration of the peaks indicates a 3.94% presence of carbonyl groups (as shown in the table above). Hydroxyl group quantification is lower in Grade F compared to Grades A to E; it is noticeable that the difference corresponds with the quantification of carbonyl groups. Therefore it can be deduced that some hydroxyl groups have been oxidized to form carbonyl.

Figure 16:
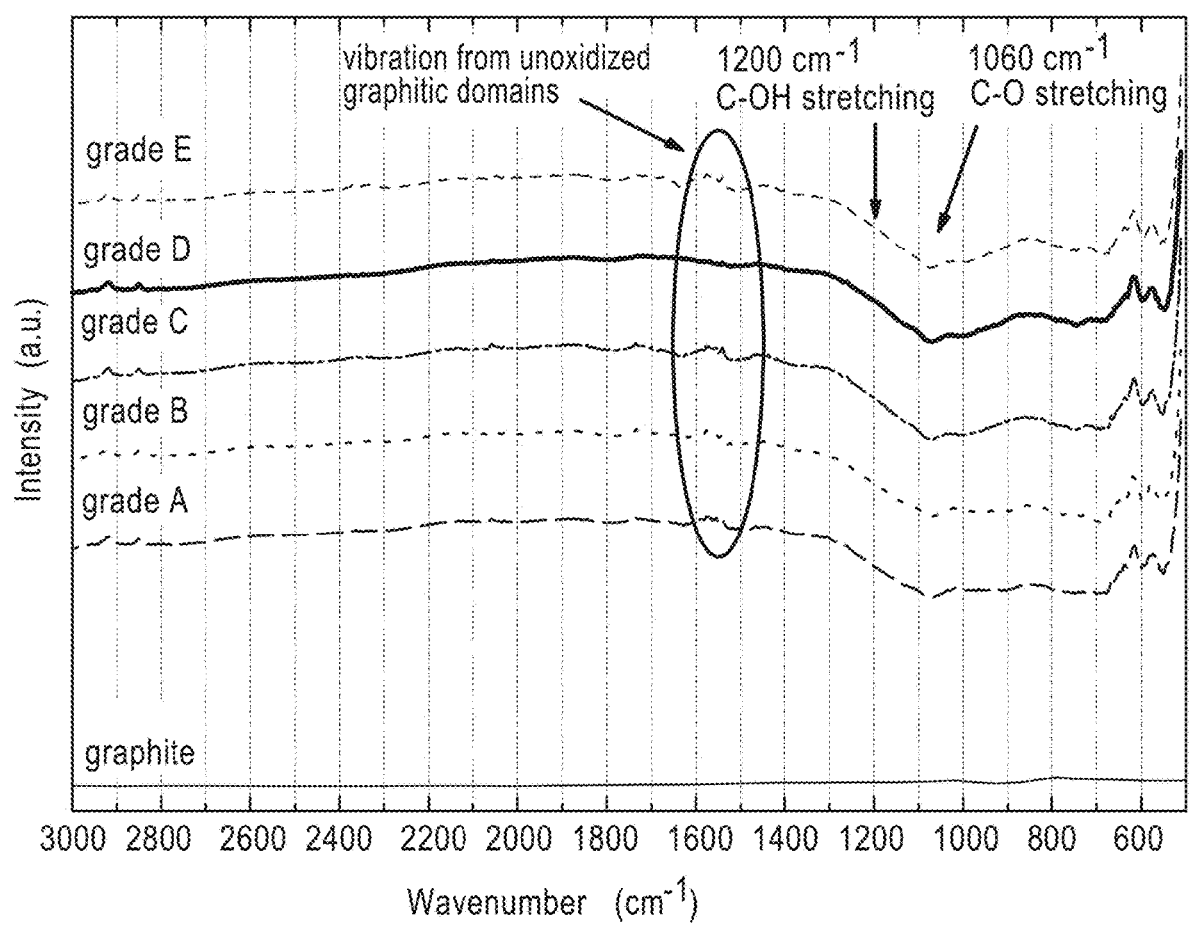
FIG. 16 a plot of example Fourier transform infrared spectroscopy by attenuated total reflection (ATR-FTIR) spectra for a series of different few-layer graphene and bulk graphite, according to an embodiment.

To characterize the edge activation and other properties of the various grades, in some of the experimental embodiments, other techniques such as Fourier transform infrared spectroscopy by attenuated total reflection (ATR-FTIR) were performed on the grades. FIG. 16 shows that all grades exhibit the C—O stretching mode around 1060 $cm^{-1}$ and the C—OH stretching mode around 1200 $cm^{-1}$ These modes confirm the presence of hydroxyl groups over the graphene flakes, including FLGs of Grade E. Around 1600 $cm^{-1}$ the vibration of graphitic domains is observed for the FLGs and composites of the grades, but not for bulk graphite due to the high number of graphitic layers. This is further evidence that FLGs and composites of grades A through E comprise few-layers of graphene, unlike the bulk or large numbers of graphite. The O—H stretching mode around 3400 $cm^{-1}$ has been observed only on the 13.2 (Grade C). This mode was also expected on all other grades except Grade E.

Figure 17:
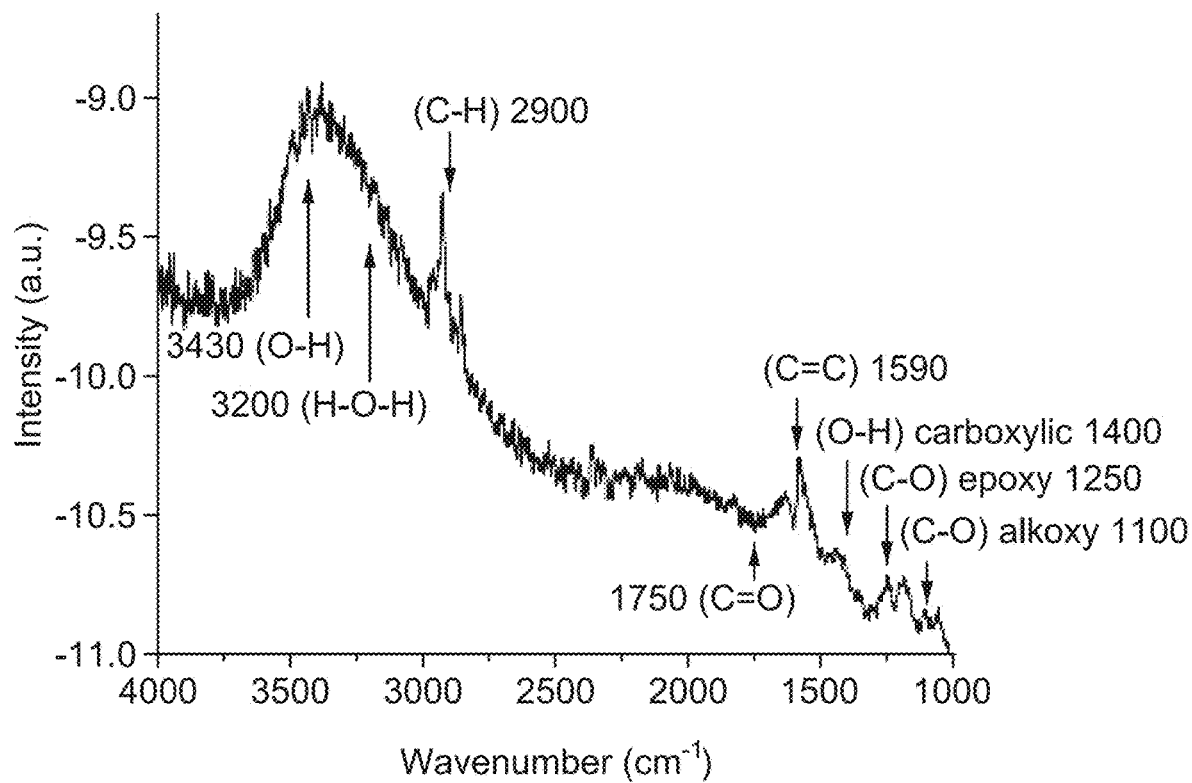
FIG. 17 a plot of example Fourier transform infrared spectroscopy by attenuated total reflection (ATR-FTIR) spectra for a graphene-graphite composite, according to an embodiment.

FTIR measurements have provided additional supporting evidence as to the XPS detection of the presence of carbonyl groups on the edges of grade F FLGs. For example, FIG. 17 shows the FTIR spectra of grade F FLGs where several significant absorption bands, corresponding to different local environments, can be identified:

around 1100 $cm^{-1}$ wavenumber, due to the stretching mode of alkoxy C—O bonds, around 1250 $cm^{-1}$ wavenumber, due to the epoxy C—O asymmetric stretching vibrations, around 1400 $cm^{-1}$ wavenumber, associated with the carboxy O—H bonds, around 1590 $cm^{-1}$ wavenumber, corresponding to C=C, from the non-oxidized $sp^2$ carbon bonds, around 1750 $cm^{-1}$ wavenumber, associated with C—O, stretching vibrations, around 3200 $cm^{-1}$ wavenumber, comprising contribution from the adsorbed water molecules, and around 3430 $cm^{-1}$ wavenumber associated with the O—H oscillations in the carboxylic groups, on the edges of graphene planes, as well as in between the graphene sheets.

These measurements show that carbonyl groups were added to the hydroxyl groups on the edges of the platelets, and in general provide further evidence of edge activation of the FLGs and composites of grades A-F.

Figure 18:
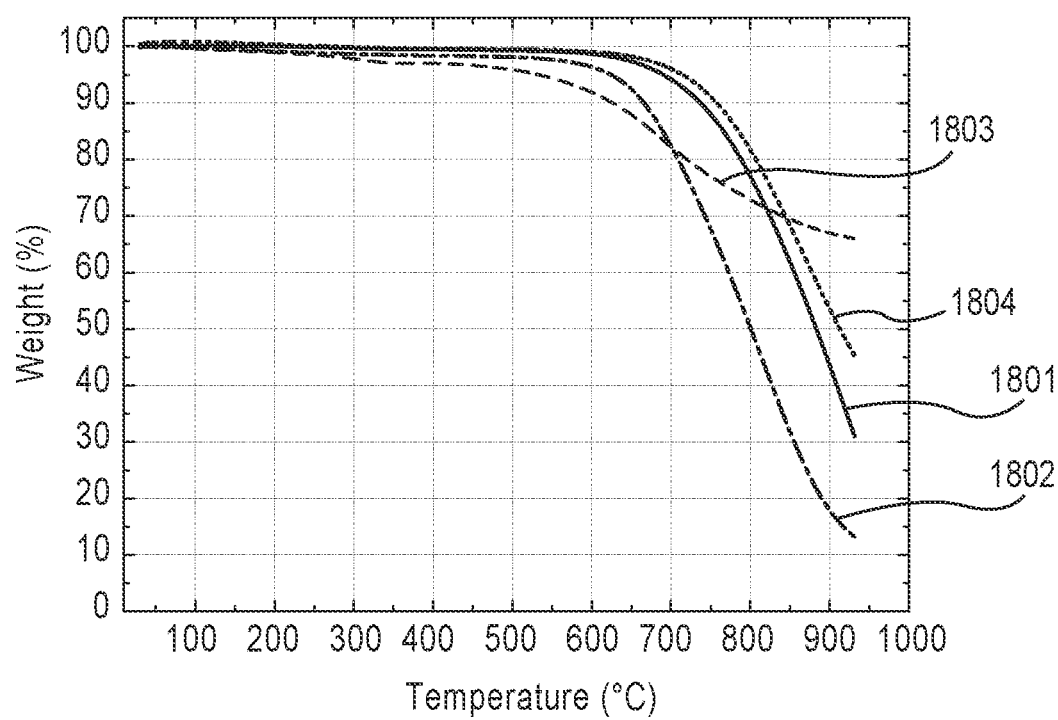
FIG. 18 is a plot showing the results of thereto gravimetric analysis of different few-layer graphene, graphene-graphite composite and bulk graphite indicating the thermal stability of these graphene-based materials.

As have been mentioned above and would be discussed in greater detail below, the products of the wet ball milling process disclosed herein can be used in a diverse set of applications. For some of these applications, it may be useful to determine the characteristics of the products under different conditions, for example, their thermal stability. In some embodiments, thermal stability may be investigated via a thermo gravimetric analysis (TGA) that tracks the thermal transitions of the materials as a function of temperature, transitions such as but not limited to loss of solvent and plasticizers in polymers, water of hydration in inorganic materials, and/or decomposition of the material. A TGA analysis was performed for each grade by raising the temperature of a furnace containing the FLGs or the composites and measuring the sample weight. FIG. 18 shows the weight percentage of the sample remaining after mass loss as a function of temperature when the temperature is raised to 930° C. at 10° C./min rate in air for the FLGs of Grades A and B (1801), Grades C and D (1802), Grade F (1803) and Grade E (1804). For grades A, B, C and D, the degradation starts at around 690° C., in contrast to 800° C. for graphite and 600° C. for a graphene layer, indicating that these grades comprise few-layer graphene products, agreeing with the results of other measurements such as Raman spectroscopy. In some embodiments, loss prior to degradation has been observed (e.g., at less than 2%) and can be ascribed primarily residue from the washing process. For grade F (1803), two weight decreases can be observed in the TGA data, where at around 250° C., structural water, hydroxyl and carbonyl groups are removed from the powder, and at around 592° C., the decomposition of the FLG occurs. This decomposition temperature is slightly lower than that for Grade D but still very close, showing that the pristine nature of the FLG flakes has been conserved. In general, these results show the heat resistance properties of the FLGs produced as a result of the wet ball milling process.

With respect to the graphene-graphite composite of grade E, the decomposition temperature can be seen to be around 710° C., which is higher than Grades A, B, C, and D. These results show that thinned graphite (e.g., forming the composite) can have strong influence on thermal properties of Grade E, and means that Grade E is more heat resistant than graphene and/or FLGs.

Some explanations for these unique properties come from the difference in synthesis process and consequently morphology of Grade E composites compares to the FLGs of, for example, Grades A, B, C and D. For example, the synthesis process of Grade E can be divided in two parallel processes that give a thinned graphite and a graphene. For example, the SEM image of Grade E in FIG. 8F shows a wide range in particle size within the powder. Some flakes have the same lateral size as Grades B or D (e.g., 1-5 µm) and some are almost millimeter sized. The structure of Grade E can be described as small graphene flakes sitting on larger, thinned graphite particles, and as a result, this material can have different characteristics than single and/or few-layer graphene.

However, XPS analysis demonstrates that the wet ball milling process disclosed herein can induce hydroxyl activated edges (FIG. 15), allowing for dispersibility of the powder in various medium, both organic and water-based. Further, with respect to electrical conductivity, composite graphene-thinned graphite Grade E can be expected to have a much better conductivity than Grades A, B, C and D, since the number of electrons available is much higher even though the free electron mobility of graphite (including thinned) is lower compared to FLGs.

Applications

Currently, monolayer graphene produced by CVD processes and lower quality graphene are commercially available. However, there are several issues that render these graphene products unsuitable for several applications. For example, the CVD process is realistically not scalable for large scale production, and the lower quality products contain significant defects, have small lateral sizes, contain no activated edges, etc. The graphene-based products produced by the wet ball milling processes disclosed herein have properties that make them suitable for a diverse set of applications. In some embodiments, the FLGs and the composites have low defects, activated edges, relatively large lateral dimensions and/or few layers, and also are dimensionally tunable and dispersive. Some of the applications for which the thinned graphite, the FLGs, graphene-graphite composites, etc., can be used for are listed below.

Lubricants

Graphene can provide significant benefits for lubricants in at least three ways, including as an additive to improve oil-based lubricants, as a replacement for existing, hazardous additives (e.g., for current environmentally unfriendly lubricant additives such as molybdenum disulfide or boric acid), and as a replacement for graphite-based lubricants. As an additive, for example, adding graphene to existing oil-based lubricants provides many advantages including reducing friction, forming an extremely strong and durable surface layer on the target surfaces that can be stable under a wide range of loads and temperatures, improving lubricants to act as excellent cooling fluid removing heat produced by friction or from external sources, and improving lubricants to protect surfaces from the attack of aggressive products formed during operation (including anti-corrosion protection). For example, a test by lubricant specialists of the graphene based products produced by the processed disclosed herein has shown a very low loading of about 1 mg/mL in paraffin oil, the coefficient of friction was reduced by about 66%.

Graphite is a commonly used solid lubricant, especially in moist air (but may not protect the surface from corrosion). It has been shown that graphene works equally well in humid and dry environments. Furthermore, graphene is able to drastically reduce the wear rate and the coefficient of friction (COF) of steel. The marked reductions in friction and wear can be attributed to the low shear and highly protective nature of graphene, which also prevents oxidation of the steel surfaces when present at sliding contact interfaces.

Using the graphene-based products of the wet ball milling processes disclosed herein as additives, even in minute amounts such as between 1.0% and 0.1% of graphene by weight as an additive, the above-mentioned advantages of graphene in lubricants can be realized. Further, the minute amount creates minimal or no impact to existing manufacturing processes, also allowing for a compact product development and introduction timeline. The higher quality of the graphene-based products allow for minute amounts to achieve significant improvements in lubricant performance, which partly is the result of the ability to tune the dimensions of the graphene nanoplatelets and their dispersiveness in other materials. In some embodiments, it is useful to have the ability to tune the dimensions of the graphene nanoplatelets depending on the target application. The dimensions can be lateral size (e.g., diameter)—larger nanoplatelets generally provide more continuous surface protection, and dispersion—smaller particles are often more easily dispersed in the target lubricant.

Coatings and Paints

Coatings are used to improve the surface properties of a substrate, properties such as corrosion resistance, durability, wettabillity, and adhesion. Paints are a special category of coating, used to protect, beautify and reduce maintenance requirements. Graphene, alone or as part of a composite, displays excellent characteristics for the coating industry including water and oil resistance, extraordinary barrier properties (including anti-corrosion), superb frictional properties, and high wear resistance. In addition, graphene has excellent electrical and thermal properties and thin layers of graphene are optically transparent. Further, graphene based coatings exhibit excellent mechanical properties as well as being largely or completely impermeable to gases, liquids and strong chemicals. Examples include using graphene based paint to cover glassware or copper plates that may be used as containers for strongly corrosive acids. Other areas of applications include industries in medicine, electronics, nuclear and shipbuilding, were identified. The graphene based products of the wet ball milling processes of this disclosure can be used to accomplish the aforementioned applications of graphene in as a coating additive.

Composite Materials

Composite materials are made from two or more different materials that are combined together to create a new material with characteristics different from the individual components. The goal is to create a superior new material with improved performance in some aspect such as strength, less weight or lower cost. Graphene, with its unprecedented array of material characteristic improvements is a natural candidate for use in advanced composite materials. Leading candidates for graphene-based composites include structural and skin components for airplanes, cars, boats and spacecraft. In these applications, graphene can be used to increase thermal conductivity and dimensional stability, increase electrical conductivity, improve barrier properties, reduce component mass while maintaining or improving strength, increase stiffness and toughness (impact strength), improve surface appearance (scratch, stain and mark resistance), and increase flame resistance. The graphene based products including the graphene-graphite composite and the edge activated FLGs discussed in this disclosure can be used just for such applications. Examples of the effects of these products include improving mechanical/structural properties, thermal and/or electrical conductivity, wear resistance and long lasting surface properties, anti-corrosion and anti-erosion properties, particularly under dynamic loads; and electromagnetic shielding.

Thermal Management

The demand for innovative thermal management materials and adhesives is driven by the harmful heat generated by ever-shrinking electronic components and systems in all areas of the electronics market, including aerospace, automotive, consumer, communications, industrial, medical, and military. In recent years, there has been an increasing interest in new and advanced materials for thermal interface materials (TIM) and heat conduction. The important basic factors to consider when selecting a thermal interface material (TIM) are a high, thermally conductive interface material that is as thin as possible, a material that forms an excellent thermal interface with a wide range of materials and a material that eliminates voids or air pockets between the heat generating device surface and the heat sink surface. The graphene based products disclosed in this disclosure possess superior electrical conductivity, and ultra-low interfacial thermal resistance against metal, and as such are suitable for thermal management applications. Further, the edge activation facilitates mixing with other materials such as existing TIM materials.

Energy

Graphene-based nanomaterials have many promising applications in energy-related areas. Graphene improves both energy capacity and charge rate in rechargeable batteries; graphene makes superior supercapacitors for energy storage; transparent and flexible graphene electrodes may lead to a promising approach for making solar cells that are inexpensive, lightweight and manufactured using roll-to-roll techniques; graphene substrates show great promise for catalytic systems in hydrogen storage for automotive and grid storage applications.

The graphene based products of the present disclosure can be particularly suited to electrode-based energy solutions, and specifically for improving the performance of Li-ion anodes. Current Li-ion anodes are made from graphite while new generation anodes are being fabricated from composites such as silicon-carbon. Graphene composite anodes, fabricated using a composite of graphene and metals, oxides or polymers, can have even better performance in the areas of power density, energy density, and battery cycle life. Further, graphene based composites can often provide production advantages while also helping to address the overheating and swelling problems often experienced by advanced battery cells. In addition, the excellent thermal and electrical conductivity, and the ability to mix and form composites with a wide range of other materials, of the graphene based products of the present disclosure allow for its use in battery technologies, including effecting improvements in the performance of Li-ion batteries.

While various embodiments of the system, methods and devices have been described above, it should be understood that they have been presented by way of example only, and not limitation. Where methods and steps described above indicate certain events occurring in certain order, those of ordinary skill in the art having the benefit of this disclosure would recognize that the ordering of certain steps may be modified and such modification are in accordance with the variations of the invention. For example, the non-aqueous electrolyte can also include a gel polymer electrolyte. Additionally, certain of the steps may be performed concurrently in a parallel process when possible, as well as performed sequentially as described above. The embodiments have been particularly shown and described, but it will be understood that various changes in form and details may be made.

The invention claimed is:

1. A composition, comprising:
a plurality of few layer graphene particles, the plurality of few layer graphene particles having thickness of 1 graphene layer to about 10 graphene layers and an average lateral dimension of about 500 nm to about 5 µm, the composition having no crystalline imperfection, such that the composition has a G-band intensity to D-band intensity ratio between about 14 and about 28,
wherein the plurality of few layer graphene particles have a purity of greater than about 95% by weight.

2. The composition of claim 1, wherein the plurality of few layer graphene particles have an aspect ratio of at least about 50.

3. The composition of claim 2, wherein the plurality of few layer graphene particles have an aspect ratio of at least about 100.

4. The composition of claim 3, wherein the plurality of few layer graphene particles have an aspect ratio of at least about 250.

5. The composition of claim 1, wherein the plurality of few layer graphene particles have an aspect ratio in a range of about 50 to about 1,000.

6. The composition of claim 1, wherein the plurality of few layer graphene particles have an aspect ratio in a range of about 100 to about 500.

7. The composition of claim 1, wherein the plurality of few layer graphene particles have an aspect ratio in a range of about 250 to about 1,000.

8. A composition, comprising:
a plurality of few layer graphene particles, the plurality of few layer graphene particles having a thickness of less than about 5 nm and an average lateral dimension of at least about 500 nm, the composition having no crystalline imperfection, such that the composition has a G-band intensity to D-band intensity ratio between about 14 and about 28,
wherein the plurality of few layer graphene particles have a purity of greater than about 95% by weight.

9. The composition of claim 8, wherein the plurality of few layer graphene particles have an aspect ratio of at least about 50.

10. The composition of claim 9, wherein the plurality of few layer graphene particles have an aspect ratio of at least about 100.

11. The composition of claim 10, wherein the plurality of few layer graphene particles have an aspect ratio of at least 250.

12. The composition of claim 8, wherein the plurality of few layer graphene particles have a thermal stability up to about 690° C.

13. The composition of claim 8, wherein the thickness of the plurality of few layer graphene particles is 1 graphene layer to about 10 graphene layers.

14. A composition, comprising:
a plurality of few layer graphene particles, the plurality of few layer graphene particles having:
a thickness of less than about 5 nm,
an average lateral dimension of at least about 500 nm, and
an aspect ratio of at least about 100,
wherein the composition has no crystalline imperfection, such that the composition has a G-band intensity to D-band intensity ratio between about 14 and about 28, and
wherein the plurality of few layer graphene particles have a purity of greater than about 95% by weight.

15. The composition of claim 14, wherein the plurality of few layer graphene particles have a thermal stability up to about 690° C.

16. The composition of claim 14, wherein the aspect ratio is in a range of about 50 to about 1,000.

17. The composition of claim 14, wherein the aspect ratio is in a range of about 100 to about 500.

18. The composition of claim 14, wherein the aspect ratio is in a range of about 250 to about 1,000.

19. The composition of claim 14, wherein the thickness of the plurality of few layer graphene particles is 1 graphene layer to about 10 graphene layers.

20. The composition of claim 14, wherein the average lateral dimension is at least about 1 μm.

* * * * *

UNITED STATES PATENT AND TRADEMARK OFFICE
CERTIFICATE OF CORRECTION

PATENT NO. : 11,367,540 B2
APPLICATION NO. : 16/409153
DATED : January 5, 2021
INVENTOR(S) : Marie Bozalina et al.

It is certified that error appears in the above-identified patent and that said Letters Patent is hereby corrected as shown below:

In the Claims

Column 28, Lines 16-17 (Claim 16):
"The composition of claim 14, wherein the aspect ratio is in a range of about 50 to about 1,000."
Should be:
"The composition of claim 14, wherein the aspect ratio is in a range of about 100 to about 1,000."

Signed and Sealed this
Twenty-fifth Day of October, 2022

Katherine Kelly Vidal
*Director of the United States Patent and Trademark Office*